(12) United States Patent
Li et al.

(10) Patent No.: US 11,777,154 B2
(45) Date of Patent: *Oct. 3, 2023

(54) BATTERY MANAGEMENT SYSTEMS AND METHODS, AND OPEN CELL DETECTION SYSTEMS

(71) Applicant: O2Micro Inc., Santa Clara, CA (US)

(72) Inventors: Yan Li, Wuhan (CN); Weidong Xue, Shanghai (CN)

(73) Assignee: O2Micro Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/940,931

(22) Filed: Sep. 8, 2022

(65) Prior Publication Data

US 2023/0009240 A1 Jan. 12, 2023

Related U.S. Application Data

(63) Continuation of application No. 16/881,533, filed on May 22, 2020, now Pat. No. 11,469,453.

(30) Foreign Application Priority Data

May 24, 2019 (CN) .......................... 201910439990.1

(51) Int. Cl.
| | |
|---|---|
| *H01M 10/42* | (2006.01) |
| *G01R 19/165* | (2006.01) |
| *G01R 31/3835* | (2019.01) |
| *G01R 31/396* | (2019.01) |
| *H02J 7/00* | (2006.01) |
| *H03K 5/24* | (2006.01) |

(52) U.S. Cl.
CPC .. *H01M 10/4264* (2013.01); *G01R 19/16542* (2013.01); *G01R 31/3835* (2019.01); *G01R 31/396* (2019.01); *H02J 7/0016* (2013.01); *H02J 7/0019* (2013.01); *H03K 5/24* (2013.01); *H01M 2010/4271* (2013.01); *H01M 2010/4278* (2013.01)

(58) Field of Classification Search
CPC ................................................. H01M 10/4624
USPC ............................................................ 429/7
See application file for complete search history.

(56) References Cited

U.S. PATENT DOCUMENTS

| | | | |
|---|---|---|---|
| 2012/0025835 A1* | 2/2012 | Chandler | ................ B60L 58/22 324/433 |
| 2012/0146652 A1* | 6/2012 | Aoki | .................... G01R 31/396 324/433 |

(Continued)

*Primary Examiner* — Yalkew Fantu

(57) ABSTRACT

An open cell detection system includes a battery management system. The battery management system includes a control unit that transmits an open cell detection signal, to enable a balance unit for a first time period and to disable it for a second time period, and to enable an under-voltage comparison unit and an over-voltage comparison unit for a third time period. The under-voltage comparison unit compares a voltage with a first open cell threshold and outputs a first comparison result in the third time period. The over-voltage comparison unit compares a voltage with a second open cell threshold and outputs a second comparison result in the third time period. A judging unit determines whether a connection between a first battery unit and the battery management system is inoperative based on the first and second comparison results.

20 Claims, 8 Drawing Sheets

(56) References Cited

U.S. PATENT DOCUMENTS

2014/0167778 A1\* 6/2014 Todani ............... G01R 31/3835
  324/434
2016/0105042 A1\* 4/2016 Taylor ................. H01M 10/446
  320/134

\* cited by examiner

BATTERY MANAGEMENT SYSTEMS AND METHODS, AND OPEN CELL DETECTION SYSTEMS

RELATED APPLICATIONS

This application is a Continuation Application of the co-pending commonly-owned U.S. patent application, Ser. No. 16/881,533, filed on May 22, 2020, now U.S. Pat. No. 11,469,453, which claims benefit under 35 U.S.C. § 119(a) to Application No. 201910439990.1, filed with the National Intellectual Property Administration of the People's Republic of China (CNIPA) on May 24, 2019, each of which is hereby incorporated by reference in its entirety.

BACKGROUND

The accuracy of a cell voltage measurement depends on whether the connection between the battery management system (BMS) and the cell is robust. Usually, nickel straps or electric wires are used for the connections. At the cell side, a nickel strap or electric wire is soldered to the cell tap. At the BMS side, a nickel strap is directly soldered to a printed circuit board (PCB), and an electric wire is connected to the PCB via a connector. However, sometimes the connection between the BMS and a cell may degrade or break, causing an open cell failure (Cell Tap Open, CTO). Once an open cell failure occurs, the cell voltage measurement becomes inaccurate. Therefore, it is not possible to achieve timely and accurate battery management functions. For example, in one scenario, when the voltage of a cell is greater than an over-voltage (OV) threshold, the BMS should perform an OV protection operation. However, when the OV situation cannot be detected due to an open cell failure in the BMS, the OV protection operation will not be performed. For example, in another scenario, all cell voltages are normal but, due to the open cell failure in the BMS, the BMS improperly and unnecessarily performs the OV or an under-voltage (UV) protection operation.

SUMMARY

Embodiments in accordance with the present invention provide methods and systems pertaining to open cell detection.

In embodiments, an open cell detection system includes a battery management system coupled to battery units. The battery management system includes: a balance unit and an under-voltage comparison unit, coupled to a first battery unit; an over-voltage comparison unit, coupled to a second battery unit; a control unit, operable for transmitting an open cell detection signal, to enable the balance unit for a first time period and then to disable the balance unit for a second time period, and to enable the under-voltage comparison unit and the over-voltage comparison unit for a third time period. The under-voltage comparison unit is operable for comparing a voltage received by the under-voltage comparison unit with a first open cell threshold and for outputting a first comparison result in the third time period. The over-voltage comparison unit is operable for comparing a voltage received by the over-voltage comparison unit with a second open cell threshold and for outputting a second comparison result in the third time period. The second open cell threshold is greater than the first open cell threshold. The battery management system also includes a judging unit that is operable for determining whether a connection between the first battery unit and the battery management system is inoperative based on the first comparison result and the second comparison result.

In embodiments, an open cell detection method includes: transmitting, using a control unit of the battery management system, an open cell detection signal; enabling the balance unit for the first time period and disabling the balance unit for the second time period based on the open cell detection signal; enabling the under-voltage comparison unit and the over-voltage comparison unit for the third time period based on the open cell detection signal after the second time period ends; comparing, using the under-voltage comparison unit, the voltage received by the under-voltage comparison unit with the first open cell threshold, and outputting the first comparison result in the third time period; comparing, using the over-voltage comparison unit, the voltage received by the over-voltage comparison unit with the second open cell threshold, and outputting the second comparison result in the third time period; and determining, using the judging unit, whether a connection between the first battery unit and the battery management system is inoperative based on the first comparison result and the second comparison result.

BRIEF DESCRIPTION OF THE DRAWINGS

Features and advantages of embodiments of the present invention will become apparent as the following detailed description proceeds, and upon reference to the drawings, wherein like numerals depict like parts, and in which.

DETAILED DESCRIPTION

Reference will now be made in detail to the embodiments of the present invention. While the invention will be described in combination with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computing system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent form the following discussions, it is appreciated that throughout the present disclosure, discussions utilizing terms such as "calculating," "recording," "reading," "acquiring," "selecting," "determining," "transmitting," "enabling," comparing," "performing," "turning on," or "turning off" or the like, refer to actions and processes of a computing system or similar electronic computing device or processor. A computing system or similar electronic computing device manipulates and transforms data represented as physical (electronic) quantities within the computing system memories, registers or other such information storage, transmission or display devices.

Figure 1:
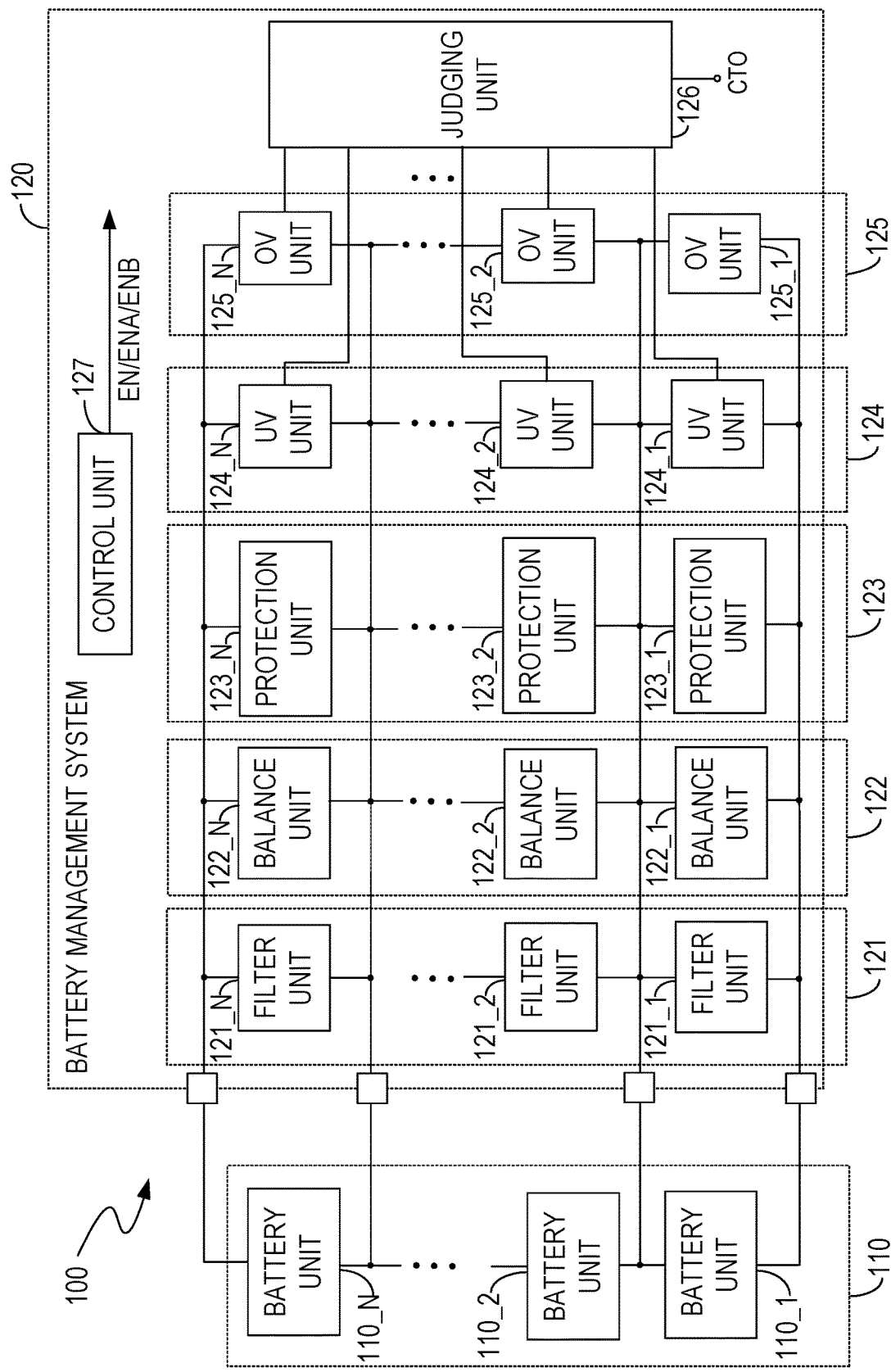
FIG. 1 shows a block diagram illustrating an open cell detection system, in accordance with embodiments of the present invention.

FIG. 1 shows a block diagram illustrating an open cell detection system 100, in accordance with embodiments of the present invention. The open cell detection system 100 includes a battery management system 120 coupled to multiple battery units 110.

The battery units 110 are operable for providing a voltage for the battery management system 120 to detect whether a connection between the battery units 110 and the battery management system 120 is inoperative (e.g., broken or degraded or not operating satisfactorily). The battery units 110 include a first battery unit 110_1, a second battery unit 110_2, ..., and an N-th battery unit 110_N. The first battery unit 110_1, the second battery unit 110_2, ..., and the N-th battery unit 110_N are coupled in series. The two terminals of the n-th battery unit 110_n (n=1, 2, ..., N) are each coupled to the battery management system 120. If the two terminals of the n-th battery unit 110_n are properly (e.g., operatively) connected to the battery management system 120, then the connection between the n-th battery unit 110_n and the battery management system 120 is referred to herein as a normal connection. If the two terminals of the n-th battery unit 110_n are not properly connected to the battery management system 120, then the connection between the n-th battery unit 110_n and the battery management system 120 is referred to herein as an open cell failure (Cell Tap Open, CTO).

The battery management system 120 includes multiple filter units 121, multiple balance units 122, multiple protection units 123, multiple under-voltage comparison units 124 and multiple over-voltage comparison units 125. The battery unit 110_n, for example, corresponds to a respective filter unit 121_n, balance unit 122_n, protection unit 123_n, under-voltage comparison unit 124_n and over-voltage comparison unit 125_n. The battery management system 120 further includes a judging unit 126 and a control unit 127. The output terminals of each of the under-voltage comparison units 124 and each of the over-voltage comparison units 125 are coupled to the judging unit 126.

As will be described further below, the control unit 127 is operable for transmitting an open cell detection signal END to perform open cell detection on each of the battery units 110. The control unit 127 is also operable for transmitting an under-voltage detection signal ENA to perform under-voltage detection on each of the battery units 110. The control unit 127 is also operable for transmitting an over-voltage detection signal ENB to perform over-voltage detection on each of the battery units 110. Also, the control unit 127 performs an under-voltage/over-voltage protection operation according to comparison results output by each of the under-voltage comparison units 124 and each of the over-voltage comparison units 125.

The filter units 121 include a first filter unit 121_1, a second filter unit 121_2, ..., and an N-th filter unit 121_N. The filter units 121 are coupled in parallel with the battery units 110. Each of the filter units 121 is operable for filtering out the high frequency components of a voltage provided by a respective battery unit of the battery units 110, thus eliminating unwanted noise components. For example, the n-th filter unit 121_n is operable for filtering out the high frequency components of a voltage provided by the n-th battery unit 110_n, n=1, 2, ..., N.

The balance units 122 include a first balance unit 122_1, a second balance unit 122_2, ..., and an N-th balance unit 122_N. The balance units 122 are coupled in parallel with the filter units 121. The n-th balance unit 122_n (n=1, 2, ..., N) is enabled for a first time period T1, then is disabled for a second time period T2, according to the open cell detection signal EN transmitted by the control unit 127. The enabling/disabling procedure is described in more detail below.

The protection units 123 include a first protection unit 123_1, a second protection unit 123_2, ..., and an N-th protection unit 123_N. The protection units 123 are coupled in parallel with the balance units 122. Each of the protection units 123 is operable for clamping a voltage provided by a respective battery unit of the battery units 110. For example, the n-th protection unit 123_n is operable for clamping a voltage provided by the n-th battery unit 110_n within a preset value $V_{SET}$, to avoid burning out the battery management system 120, n=1, 2, ..., N.

The under-voltage comparison units 124 include a first under-voltage comparison unit 124_1, a second under-voltage comparison unit 124_2, ..., and an N-th under-voltage comparison unit 124_N. The under-voltage comparison units 124 are coupled to the protection units 123. At the end of the second time period T2, the n-th under-voltage comparison unit 124_n (n=1, 2, ..., N) is enabled for a third time period T3 according to the open cell detection signal EN transmitted by the control unit 127. During the third time period T3, the n-th under-voltage comparison unit 124_n compares a voltage that it receives with a first open cell threshold $V_{CTO1}$ and outputs a first comparison result. This procedure is described in more detail below.

Also, at the end of the third time period T3, the n-th under-voltage comparison unit 124_n (n=1, 2, ..., N) is enabled for a fourth time period T4 according to an under-voltage detection signal ENA transmitted by the control unit 127. During the fourth time period T4, the n-th under-voltage comparison unit 124_n compares a voltage that it receives with an under-voltage threshold Vuv and outputs a comparison result. The control unit 127 performs an under-voltage protection operation on the n-th battery unit 110_n (n=1, 2, ..., N) according to the comparison result. This procedure is described in more detail below.

The over-voltage comparison units 125 include a first over-voltage comparison unit 125_1, a second over-voltage comparison unit 125_2, ..., and an N-th over-voltage comparison unit 125_N. The over-voltage comparison units 125 are coupled to the under-voltage comparison units 124. At the end of the second time period T2, the m-th over-voltage comparison unit 125_m (m=2, 3, ..., N) is enabled for the third time period T3 according to the open cell detection signal EN transmitted by the control unit 127. During the third time period T3, the m-th over-voltage comparison unit 125_m compares a voltage that it receives with a second open cell threshold $V_{CTO2}$ and outputs a second comparison result. This procedure is described in more detail below.

Also, at the end of the fourth time period T4, the n-th over-voltage comparison unit 125_n (n=1, 2, ..., N) is enabled for a fifth time period T5 according to an over-voltage detection signal ENB transmitted by the control unit 127. During the fifth time period T5, the n-th over-voltage comparison unit 125_n compares a voltage that it receives with an over-voltage threshold $V_{OV}$ and outputs a comparison result. The control unit 127 performs an over-voltage protection operation on the n-th battery unit 110_n (n=1, 2, ..., N) based on the comparison result. This procedure is described in more detail below.

The judging unit 126 is coupled to output terminals of the under-voltage comparison units 124, and is also coupled to output terminals of the over-voltage comparison units 125 except for the over-voltage comparison unit 125_1. The judging unit 126 is operable for determining whether the connection between the n-th battery unit 110_n (n=1, 2, ..., N) and the battery management system 120 is operative or inoperative according to the first comparison result(s) and the second comparison result(s), as described below.

In an embodiment, the judging unit 126 performs an OR operation on the first comparison results output by all of the under-voltage comparison units 124 and the second comparison results output by all of the over-voltage comparison units 125 except for the first over-voltage comparison unit 125_1, and outputs an operation result. The operation result can be used to determine whether any of the connections between the battery units 110 and the battery management system 120 are broken or otherwise inoperative.

In another embodiment, the judging unit 126 performs an OR operation on the first comparison result output by the first under-voltage comparison unit 124_1 and the second comparison result output by the second over-voltage comparison unit 125_2, and outputs an operation result. That operation result can be used to determine whether the connection between the first battery unit 110_1 and the battery management system 120 is broken or otherwise inoperative. Next, the judging unit 126 performs an OR operation on the first comparison result output by the second under-voltage comparison unit 124_2 and the second comparison result output by the third over-voltage comparison unit 125_3, and outputs an operation result, which can be used to determine whether the connection between the second battery unit 110_2 and the battery management system 120 is broken or otherwise inoperative. Testing continues in this manner, until the judging unit 126 performs an OR operation on the first comparison result output by each under-voltage comparison unit 124_(n−1) and over-voltage comparison unit 125_n (n=2, ..., N), and outputs an operation result. By testing in this manner, it can be determined which battery unit of the battery units 110 is disconnected from or not adequately connected to the battery management system 120, which facilitates quickly identifying and removing or correcting the open cell failure.

Figure 2:
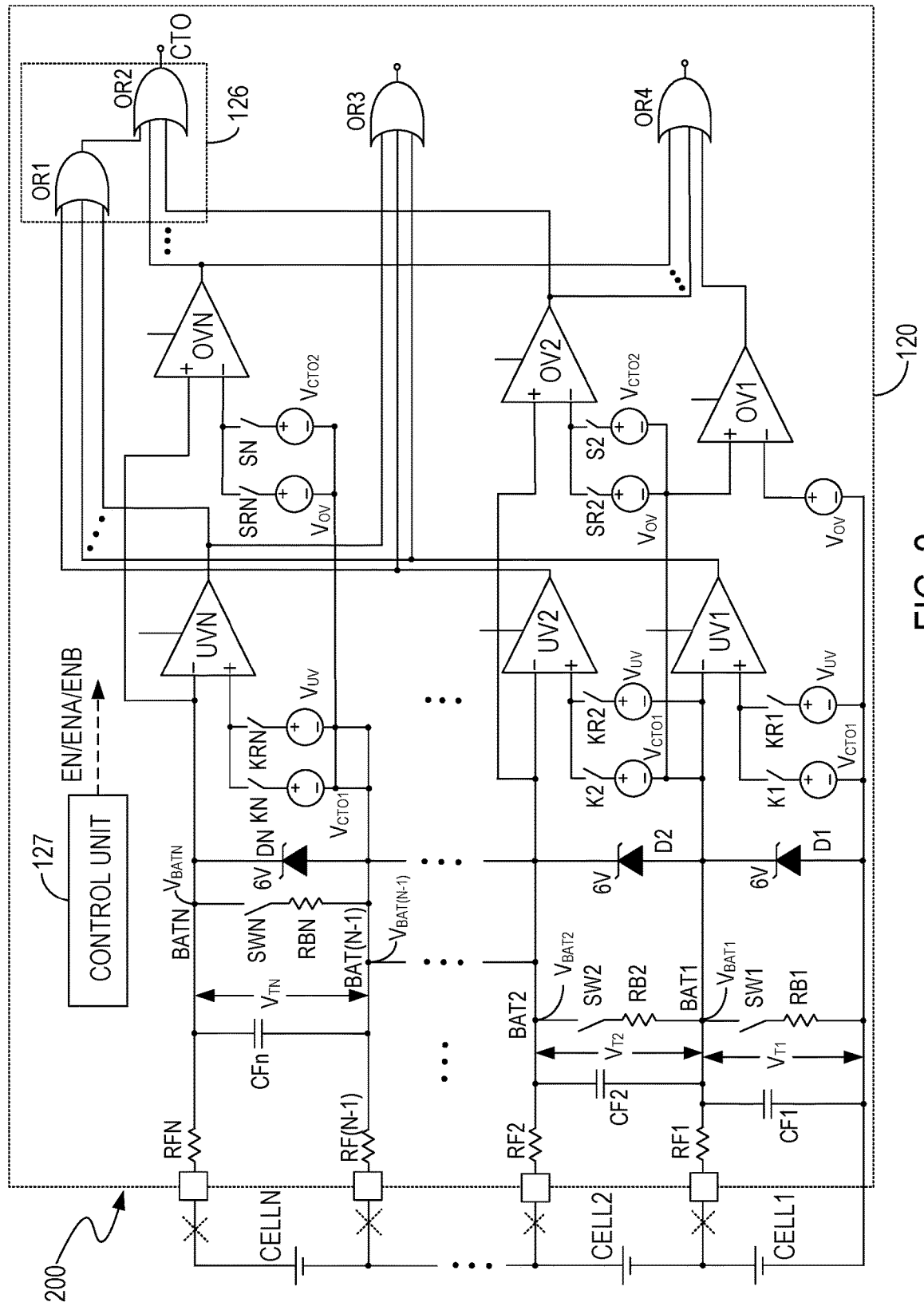
FIG. 2 shows a circuit diagram illustrating an open cell detection system, in accordance with embodiments of the present invention.

FIG. 2 shows a circuit diagram illustrating an open cell detection system 200, in accordance with embodiments of the present invention. FIG. 2 is described in conjunction with FIG. 1. In an embodiment, each battery unit 110_n includes a single cell CELLn (n=1, 2, ..., N). The cell CELL1, the cell CELL2, ..., and the cell CELLn are coupled in series. The positive and negative electrodes of the cell CELLn are each connected to the battery management system 120. If the positive and negative electrodes of a cell CELLn are properly (e.g., operatively) connected to the battery management system 120, then the connection between the cell CELLn and the battery management system 120 is referred to herein as a normal connection. If the positive and negative electrodes of the cell CELLn are disconnected from or not adequately connected to the battery management system 120, then the connection between the cell CELLn and the battery management system 120 is referred to herein as an open cell failure (Cell Tap Open, CTO). In other embodiments, each battery unit 110_n includes multiple individual cells.

In an embodiment, a voltage provided by a cell CELLn is between 1.8V and 4.6V. To protect the lifespan and safety of the cell CELLn, an operating voltage $V_{CELLn}$ of that cell is set between 2V~4.2V. A charger or load (not shown in the figure) is coupled between a negative electrode of the cell CELL1 and a positive electrode of the cell CELLN.

The n-th filter unit 121_n includes a monitoring resistor RFn and a filter capacitor CFn (n=1, 2, ..., N). The monitoring resistor RFn is coupled in series with the filter capacitor CFn, and the cell CELLn is coupled in parallel with the filter capacitor CFn. The monitoring resistor RFn serves to limit a current provided by the cell CELLn, to prevent a high peak current from burning out the battery management system 120. The filter capacitor CFn charges or discharges. Both the monitoring resistor RFn and the filter capacitor CFn are operable for filtering out the high frequency components in a voltage provided by the corresponding cell CELLn, thus eliminating the unwanted noise components.

In an embodiment, the resistance value of the monitoring resistor RFn is between 100Ω~10 kΩ, and the capacitance value of the filter capacitor CFn is between 10 nF~1 μF. The resistance value of the monitoring resistor RFn depends on both the operating voltage $V_{CELLn}$ of the cell CELLn and the condition (e.g., size) of the load. If the amount of noise is large and high reliability is needed, then the resistance value of the monitoring resistor RFn can be selected as 10KΩ to limit the peak current generated by the cell CELLn, so that the battery management system 120 will not be damaged.

The n-th balance unit 122_n includes a balance switch SWn and a balance resistor Rb (n=1, 2, ..., N). The balance switch SWn is coupled in series with the balance resistor RBn, and the filter capacitor CFn is coupled in parallel with the balance resistor RBn. When a voltage difference between two adjacent cells exceeds a preset balance value, the control unit 127 transmits a balance signal. According to the balance signal, the balance switch SWn is turned on or turned off to balance the voltage difference between the two adjacent cells until the voltage difference does not exceed the preset balance value. In an embodiment, the balance resistor RBn is 10 kΩ.

For example, if the operating voltage $V_{CELL1}$ of the cell CELL1 is 2.2V, the operating voltage $V_{CELL2}$ of the cell CELL2 is 3.8V, and the preset balance value is 0.4V, then the voltage difference between the cell CELL1 and the cell CELL2 is 1.6V, which exceeds the preset balance value. Consequently, the operating voltage of the cell CELL1 is not balanced with that of the cell CELL2. Therefore, the control unit 127 performs a balance operation. That is, the balance switch SW1 is turned off and the balance switch SW2 is turned on under the control of the control unit 127. Also, the control unit 127 adjusts the operating voltages of the cell CELL1 and the cell CELL2 through the balance resistor RB2 until the voltage difference between the cell CELL1 and the cell CELL2 is within the preset balance value, thus achieving the voltage balance.

The n-th protection unit 123_n includes a zener diode Dn (n=1, 2, . . . , N). The balance switch SWn is coupled in series with the balance resistor RBn, and the zener diode Dn is coupled in parallel with the balance resistor RBn (n=1, 2, . . . , N). The zener diode Dn clamps a voltage provided by the corresponding cell CELLn within the preset value $V_{SET}$ (e.g., 6V) to protect the battery management system 120. Specifically, the battery management system 120 generally adopts a low voltage process with a high cost performance ratio (e.g., a 5V~6V low voltage process). Although the voltage provided by the cell CELLn is generally not greater than 4.5V, there may be some high peak voltages (such as 7V) in the voltage provided by the cell CELLn. The zener diode Dn serves to clamp any high peak voltages within the preset value $V_{SET}$ (e.g., 6V) to protect the battery management system 120.

The n-th under-voltage comparison unit 124_n includes an under-voltage comparator UVn and a first switch Kn (n=1, 2, . . . , N). A non-inverting input terminal "+" of the under-voltage comparator UVn is coupled in series with the first switch Kn, an inverting input terminal "−" is coupled to the negative electrode of the zener diode Dn, an output terminal is coupled to the judging unit 126, and a first open cell threshold $V_{CTO1}$ is set on the branch where the first switch Kn is located. The first switch Kn is turned on or turned off according to the open cell detection signal EN. The under-voltage comparator UVn compares a voltage $V_{Tn}$ ($V_{Tn}=V_{BATn}-V_{BAT(n-1)}$) received by its inverting input terminal "−" with the first open cell threshold $V_{CTO1}$ and outputs a comparison result to the judging unit 126. BATn represents a node between the balance switch SWn and the monitoring resistor RFn, and $V_{BATn}$ represents the voltage value of the node BATn relative to a ground. BAT(n−1) represents a node between the balance switch SW(n−1) and the monitoring resistor RF(n−1), and $V_{BAT(n-1)}$ represents the voltage value of the node BAT(n−1) relative to a ground (n=2, . . . , N). When n=1, the inverting input terminal "−" of the under-voltage comparator UVn receives a voltage $V_{T1}=V_{BAT1}$, where $V_{BAT1}$ represents a voltage value of the node BAT1 relative to a ground.

Also, the n-th under-voltage comparison unit 124_n includes a second switch KRn. The second switch KRn is coupled in parallel with the first switch Kn. The under-voltage threshold $V_{UV}$ is set on the branch where the second switch KRn is located, and the output terminal is coupled to the control unit 127. After the second time period T2 ends, the second switch KRn is turned on or turned off according to the under-voltage detection signal ENA transmitted by the control unit 127. The under-voltage comparator UVn compares a voltage $V_{Tn}$ received by its inverting input terminal "−" with the under-voltage threshold $V_{UV}$ and outputs a comparison result.

The battery management system 120 includes an OR gate OR3. The OR gate OR3 is coupled to the output terminals of all the under-voltage comparators UVn (n=1, 2, . . . , N). The OR gate OR3 performs the OR operation on the comparison results output by each under-voltage comparator, and outputs an operation result to the control unit 127. The control unit 127 performs the under-voltage protection operation according to the operation result.

In an embodiment, when the voltages $V_{Tn}$ (n=1, 2, . . . , N) received by the inverting input terminals "−" of all the under-voltage comparators are all greater than the under-voltage threshold $V_{UV}$, all the under-voltage comparators output low-levels "0" to the OR gate OR3. The OR gate OR3 performs the OR operation and outputs a low level "0", in which case the control unit 127 determines that the operating voltage of each cell is in the normal state and does not perform any of the operations described above. That is, the connections between the battery units 110 and the load are operative. When the voltage $V_{Tn}$ received by the inverting input terminal "−" of any of the under-voltage comparator is not greater than the under-voltage threshold $V_{UV}$, then that under-voltage comparator will output a high level "1" to the OR gate OR3. The OR gate OR3 performs the OR operation and outputs a high level "1", in which case the control unit 127 determines that the operating voltage of a cell is too low and performs the under-voltage protection operation. That is, the under-voltage protection operation renders inoperative the connections between the battery units 110 and the load.

In another embodiment, the OR gate OR3 performs the OR operation on the comparison result output by the under-voltage comparator UV1, to determine whether the operating voltage $V_{CELL1}$ of the cell CELL1 is under-voltage. Next, the OR gate OR3 performs the OR operation on the comparison result output by the under-voltage comparator UV2, to determine whether the operating voltage $V_{CELL2}$ of the cell CELL2 is under-voltage. This process continues until the OR gate OR3 performs the OR operation on the comparison result output by each of the under-voltage comparators UVn (n=1, 2, . . . , N), to determine whether the operating voltage $V_{CELLn}$ of any cell CELLn is under-voltage. In this manner, it can be determined which cell's operating voltage (if any) is under-voltage, which enables the source of the under-voltage failure to be quickly identified and removed or corrected. If the operating voltage of any cell is not under-voltage, then the control unit 127 does not perform any of the operations described above. That is, the connections between the battery units 110 and the load are operative. If the operating voltage of a cell is under-voltage, then a connection between the battery units 110 and the load is inoperative, and so the control unit 127 performs the under-voltage protection operation.

The m-th over-voltage unit 125_m includes an over-voltage comparator OVm and a third switch Sm (m=2, 3, . . . , N). An inverting input terminal "−" of the over-voltage comparator OVm is coupled in series with the third switch Sm, a non-inverting input terminal "+" is coupled to the positive electrode of the cell CELLm (m=2, 3, . . . , N), an output terminal is coupled to the judging unit 126, and the second open cell threshold $V_{CTO2}$ is set on the branch where the third switch Sm is located. The third switch Sm is turned on or turned off according to the open cell detection signal EN. The over-voltage comparator OVm compares the voltage $V_{Tm}$ received by its non-inverting input terminal "+"

with the second open cell threshold $V_{CTO2}$ and outputs a comparison result to the judging unit 126.

In addition, the m-th over-voltage comparison unit 125_m includes a fourth switch SRm (m=2, 3, . . . , N). The fourth switch SRm is couple in parallel with the third switch Sm, the over-voltage threshold $V_{OV}$ is set on the branch where the fourth switch SRm is located, and the output terminal is coupled to the control unit 127. The first over-voltage comparison unit 125_1 includes the over-voltage comparator OV1. The over-voltage comparator OV1 and the fourth switch SRm in the over-voltage comparator OVm (m=2, 3, . . . , N) are turned on or turned off according to the over-voltage detection signal ENB transmitted by the control unit 127. The over-voltage comparator OVn compares the voltage $V_{Tn}$ (n=1, 2, . . . , N) received by its non-inverting input terminal "+" with the over-voltage threshold $V_{OV}$, and outputs a comparison result.

The battery management system 120 includes an OR gate OR4. The OR gate OR4 is coupled to the output terminals of all of the over-voltage comparators OVn. The OR gate OR4 performs the OR operation on the comparison results output by each over-voltage comparator OVn, and outputs an operation result to the control unit 127. The control unit 127 performs the over-voltage protection operation according to the operation result.

In an embodiment, when the voltages $V_{Tn}$ (n=1, 2, . . . , N) received by the non-inverting input terminals "+" of all the over-voltage comparators OVn are not greater than the over-voltage threshold $V_{OV}$, each over-voltage comparator outputs a low-level "0" to the OR gate OR4. The OR gate OR4 performs the OR operation and outputs a low level "0" to the control unit 127. The control unit 127 determines that the operating voltage of each cell CELLn is in the normal state and does not perform any of the operations described above. That is, the connections between the battery units 110 and the charger are operative. When the voltage $V_{Tn}$ received by the non-inverting input terminal "+" of any of the over-voltage comparators OVn is greater than the over-voltage threshold $V_{OV}$, the over-voltage comparator OVn outputs a high level "1" to the OR gate OR4. The OR gate OR4 performs the OR operation and outputs a high level "1" to the control unit 127, in which case the control unit 127 determines that the operating voltage of a cell is too high and performs the over-voltage protection operation. That is, the over-voltage protection operation renders inoperative the connections between the battery units 110 and the charger.

In another embodiment, the OR gate OR4 performs the OR operation on the comparison result output by the over-voltage comparator OV1, to determine whether the operating voltage $V_{CELL1}$ of the cell CELL1 is over-voltage. Next, the OR gate OR4 performs the OR operation on the comparison result output by the over-voltage comparator OV2, to determine whether the operating voltage $V_{CELL2}$ of the cell CELL2 is over-voltage. This process continues until the OR gate OR4 performs the OR operation on the comparison result output by each of the over-voltage comparators OVn (n=1, 2, . . . , N), to determine whether the operating voltage $V_{CELLn}$ of any cell CELLn is over-voltage. In this manner, it can be determined which cell's operating voltage (if any) is over-voltage, which enables the source of the over-voltage failure to be quickly identified and removed or corrected. If the operating voltage of any cells is not over-voltage, then the control unit 127 does not perform any of the operations described above. That is, the connections between the battery units 110 and the charger are operative. If the operating voltage of a cell CELLn is over-voltage, then the control unit 127 performs the over-voltage protection operation. That is, the over-voltage protection operation enables the connections between the battery units 110 and the charger inoperative.

The judging unit 126 also can include one OR gate or multiple OR gates. In embodiments, the judging unit 126 includes an OR gate OR1 and an OR gate OR2. The OR gate OR1 is coupled in series with the OR gate OR2. The output terminal of the under-voltage comparator UVn is connected to the OR gate OR1 or the OR gate OR2 (n=1, 2, . . . , N). The output terminal of the over-voltage comparator OVm is connected to the OR gate OR1 or the OR gate OR2 (m=2, 3, . . . , N). Therefore, either any of the under-voltage comparators UVn (n=1, 2, . . . , N) or any of the over-voltage comparators OVm (m=2, 3, . . . , N) can output a high level "1". The OR gate OR1 or the OR gate OR2 then performs the OR operation on the high level "1" and outputs a high level "1". Consequently, it can be determined that a connection between the battery units 110 and the battery management system 120 is inoperative.

In an embodiment, the OR gate OR1 and the OR gate OR2 perform the OR operation on the comparison results output by all the under-voltage comparators and all the over-voltage comparators except the over-voltage comparator OV1, and outputs an operation result. If the operation result is the high level "1", it can be determined that a connection between the battery units 110 and the battery management system 120 is inoperative. If the operation result is the low level "0", it can be determined that the connections between the battery units 110 and the battery management system 120 are operative.

In another embodiment, the OR gate OR1 and the OR gate OR2 perform the OR operation on the comparison results output by the under-voltage comparator UV1 and the over-voltage comparator OV2, and output an operation result. If the operation result is the high level "1", it can be determined that the connection between the cell CELL1 and the battery management system 120 is inoperative. Next, the OR gate OR1 and the OR gate OR2 perform the OR operation on the comparison results output by the under-voltage comparator UV2 and the over-voltage comparator OV3, and output an operation result. If that operation result is the high level "1", it can be determined that the connection between the cell CELL2 and the battery management system 120 is inoperative. This process is repeated until the OR gate OR1 and the OR gate OR2 perform the OR operation on the comparison results output by each of the under-voltage comparators UVn (n=1, 2, . . . , N) and over-voltage comparators OVn (n=2, . . . , N) and outputs a corresponding operation result. If the operation result is the high level "1", it can be determined that the connection between the cell CELLn and the battery management system 120 is inoperative. In this manner, it can be determined which cell is not properly connected to the battery management system 120, which allows the open cell failure to be quickly detected and corrected.

Similar to open cell detection, embodiments of the present invention can also carry out under-voltage detection, over-voltage detection, and the balancing operation with fewer components, thus reducing the cost of the battery management system 120.

Figure 3:
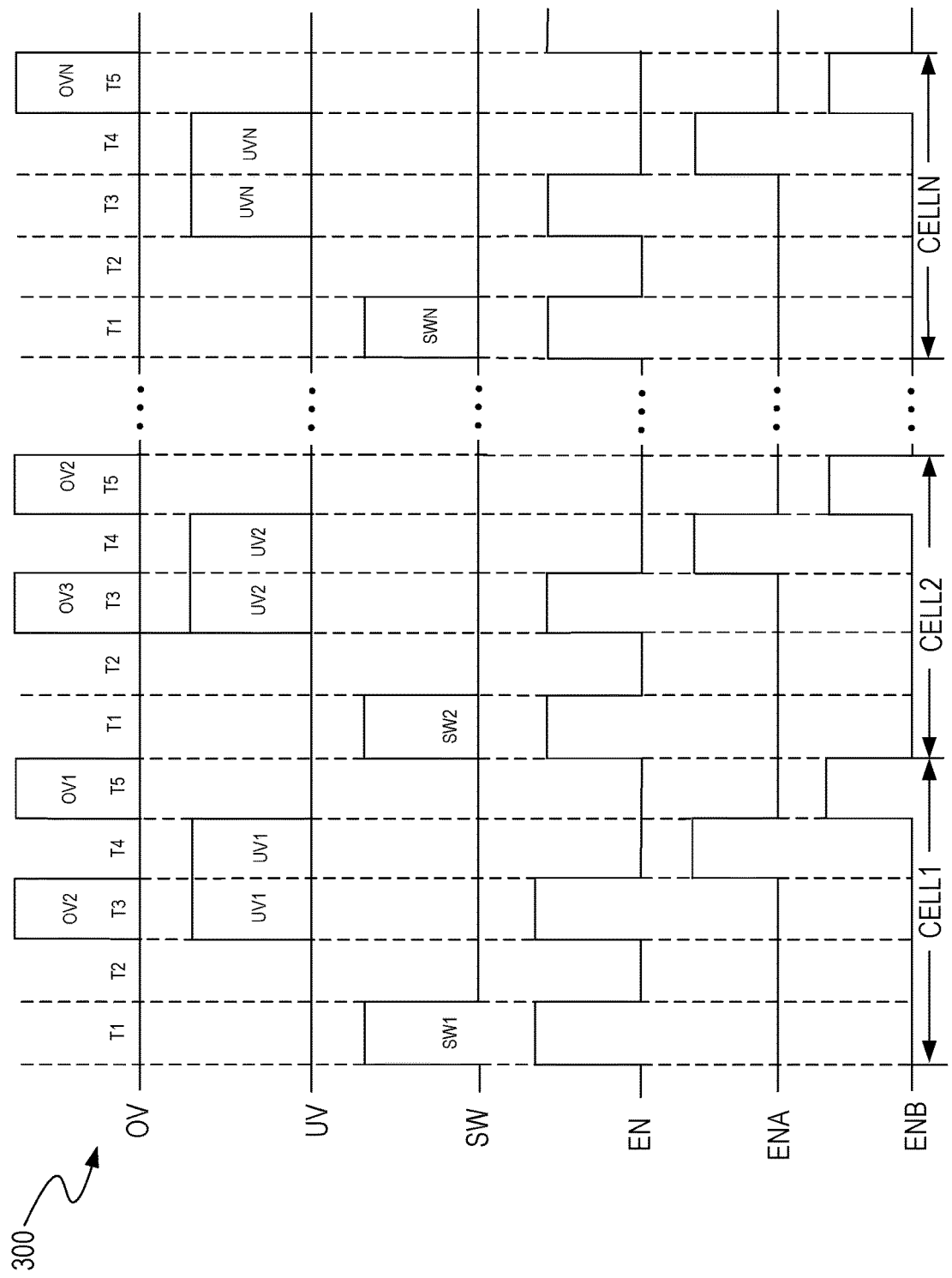
FIG. 3 shows a diagram illustrating operation of an open cell detection system, in accordance with embodiments of the present invention.

FIG. 3 shows a diagram illustrating operation of an open cell detection system 200, in accordance with embodiments of the present invention. FIG. 3 is described in conjunction with FIG. 2. In these embodiments, open cell detection, under-voltage detection and over-voltage detection are performed in order on the cell CELL1, the cell CELL2, . . . , the cell CELLn (n=1, 2, . . . , N).

At time t1, the control unit 127 transmits an open cell detection signal EN. In response to the open cell detection signal EN, the balance switch SW1 is turned on for a first time period T1, then is turned off for a second time period T2. Both the first switch K1 and the third switch S2 are turned on simultaneously for a third time period T3. In the third time period T3, the under-voltage comparator UV1 compares the voltage difference $V_{T1}$ that it receives with the first open cell threshold $V_{CTO1}$, and outputs a comparison result to the OR gate OR1 or the OR gate OR2. The over-voltage comparator OV2 compares the voltage difference $V_{T2}$ that it receives with the second open cell threshold $V_{CTO2}$, and outputs a comparison result to the OR gate OR1 or the OR gate OR2. This completes the open cell detection operation for the cell CELL1.

After the third time period T3 ends, the control unit 127 transmits an under-voltage detection single ENA. In response to the under-voltage detection single ENA, the second switch KR1 is turned on for a fourth time period T4. The under-voltage comparator UV1 compares the voltage difference $V_{T1}$ that it receives with the under-voltage threshold $V_{UV}$, and outputs a comparison result to the OR gate OR3. This completes the under-voltage detection operation for the cell CELL1.

After the fourth time period T4 ends, the control unit 127 transmits an over-voltage detection single ENB. The over-voltage comparator OV1 is turned on for a fifth time period T5 in response to the over-voltage detection single ENB. The over-voltage comparator OV1 compares the voltage difference $V_{T1}$ that it receives with the over-voltage threshold $V_{OV}$, and outputs a comparison result to the OR gate OR4. This completes the over-voltage detection operation for the cell CELL1.

Next, in response to the open cell detection signal EN, the balance switch SW2 is turned on for another first time period T1, then is turned off for another second time period T2. The first switch K2 and the third switch S3 are then turned on simultaneously for another third time period T3. The under-voltage comparator UV2 compares the voltage difference $V_{T2}$ that it receives with the first open cell threshold $V_{CTO1}$, and outputs a comparison result to the OR gate OR1 or the OR gate OR2. The over-voltage comparator OV3 compares the voltage difference $V_{T3}$ that it receives with the second open cell threshold $V_{CTO2}$, and outputs a comparison result to the OR gate OR1 or the OR gate OR2. This completes the open cell detection operation for the cell CELL2.

After the second occurrence of the third time period T3 ends, the second switch KR2 is turned on for another fourth time period T4 in response to the under-voltage detection single ENA. The under-voltage comparator UV2 compares the voltage difference $V_{T2}$ that it receives with the under-voltage threshold $V_{UV}$, and outputs a comparison result to the OR gate OR3. This completes the under-voltage detection operation for the cell CELL2.

After the second occurrence of the fourth time period T4 ends, the fourth switch SR2 is turned on for another fifth time period T5 in response to the over-voltage detection single ENB. The over-voltage comparator OV2 compares the voltage difference $V_{T2}$ that it receives with the over-voltage threshold $V_{OV}$, and outputs a comparison result to the OR gate OR4. This completes the over-voltage detection of the cell CELL2.

The operations described above continue for n=3, n=4, etc., in order until the balance switch SWn is turned on for another first time period T1, then is turned off for another second time period T2 in response to the open cell detection signal EN. The first switch Kn is turned on for another third time period T3. During the current third time period T3, the under-voltage comparator UVn compares the voltage difference $V_{Tn}$ that it receives with the first open cell threshold $V_{CTO1}$, and outputs a comparison result to the OR gate OR1 or the OR gate OR2. This completes the open cell detection operation for the cell CELLn.

After the current third time period T3 ends, the second switch KRn is turned on for another fourth time period T4 in response to the under-voltage detection single ENA. The under-voltage comparator UVn compares the voltage difference $V_{Tn}$ that it receives with the under-voltage threshold $V_{UV}$, and outputs a comparison result to the OR gate OR3. This completes the under-voltage detection operation for the cell CELLn.

After the current fourth time period T4 ends, the fourth switch SRn is turned on for another fifth time period T5 in response to the over-voltage detection single ENB. The over-voltage comparator OVn compares the voltage difference $V_{Tn}$ that it receives with the over-voltage threshold $V_{OV}$, and outputs a comparison result to the OR gate OR4. This completes the over-voltage detection operation for the cell CELLn.

The OR gate OR1, the OR gate OR2, the OR gate OR3, and the OR gate OR4 perform the OR operation on the comparison results that they receive. In an embodiment, the priority of open cell detection is higher than the priorities for under-voltage detection and over-voltage detection. In other words, in an embodiment, open cell detection is completed before the under-voltage detection and over-voltage detection operations are began. During open cell detection, if the operation result of the OR gate OR1 and the OR gate OR2 is a high level "1", then it can be determined that a connection between a cell CELLn and the battery management system 120 is inoperative; and if the operation result of the OR gate OR1 and the OR gate OR2 is a low level "0", then the operation result of the OR gate OR3 or the OR gate OR4 is considered. This avoids potential inaccuracy in the under-voltage detection and the over-voltage detection operations due to an open cell failure, and thus avoids unnecessarily performing operations such as the under-voltage protection operation and the over-voltage protection operation.

Figure 4:
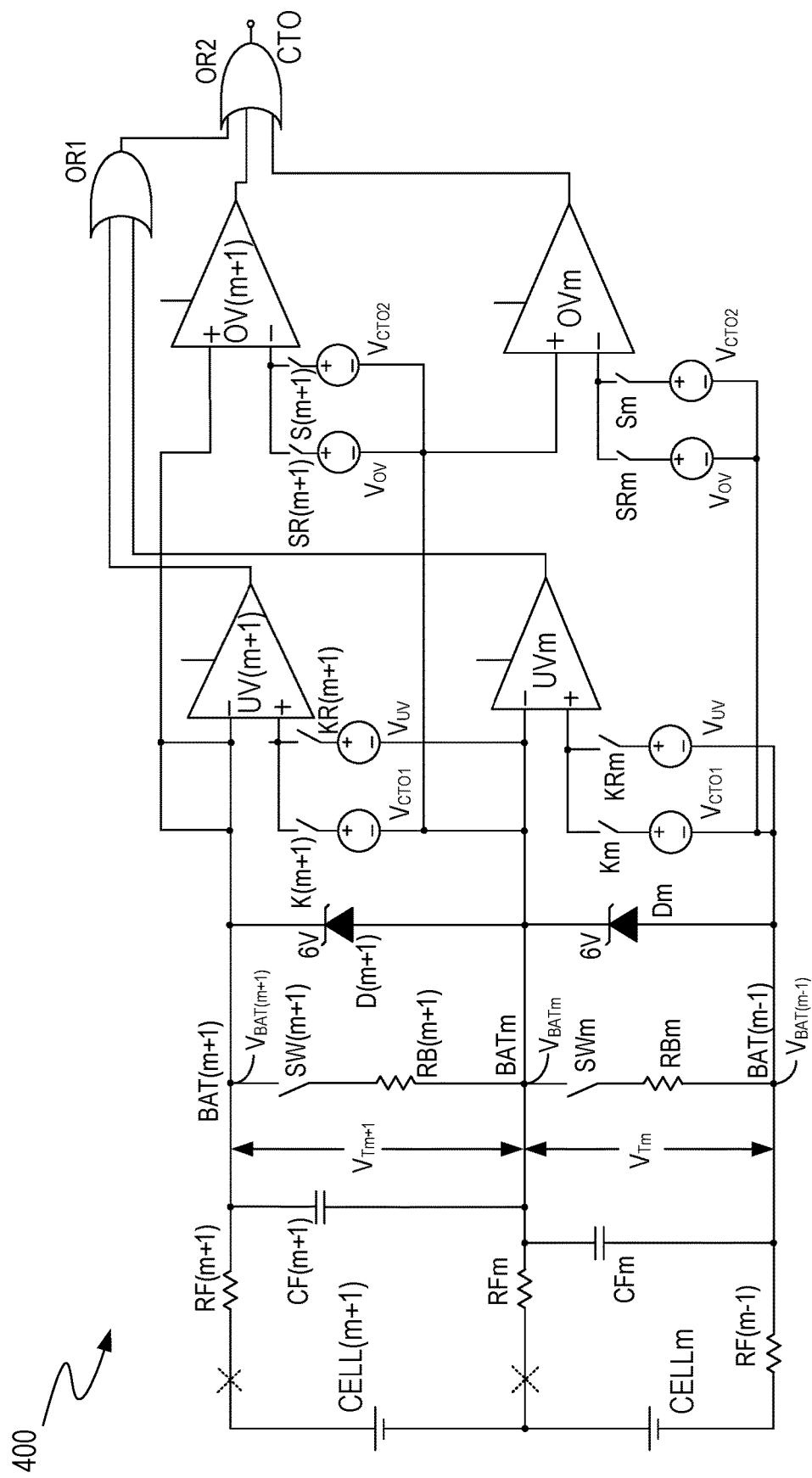
FIG. 4 shows a circuit diagram illustrating an open cell detection for a cell, in accordance with embodiments of the present invention.

FIG. 4 shows a circuit diagram 400 illustrating open cell detection for a cell CELLm, in accordance with embodiments of the present invention, where CELLm is a cell in one the battery units 110 (FIG. 1). FIG. 4 is described in conjunction with FIG. 3. Using the connection between the cell CELLm and the battery management system 120 as an example, the cases of a normal connection and an open cell failure (Cell Tap Open, CTO) are explained in detail. If the connection between the cell CELLm and the battery management system 120 is operative, it is referred to herein as a normal connection. The battery management system 120 can accurately detect the operating voltage of the cell CELLm. If the connection between the cell CELLm and the battery management system 120 is inoperative, it is referred to herein as CTO (shown as an "X" in FIG. 3), and the operating voltage $V_{CELLm}$ of the cell CELLm detected by the battery management system 120 will be inaccurate.

In an embodiment, the length of the first time period T1 is set to be long enough so that, when the connection between the cell CELLm and the battery management system 120 is inoperative, the filter capacitor CFm can discharge fully, so the voltage difference $V_{Tm}$ between a node BATm and a node BAT(m−1) can decrease to a preset voltage value (e.g., 0V) (for m=2, 3, ..., N). Specifically, according to the properties of a discharge circuit of a resistor-capacitor (RC), when a discharging time of a capacitor is three to five times a time constant, the stored energy of the capacitor will be completely discharged. Therefore, the first time period T1 is set so that it is three to five times a first time constant $\tau_1$. The first time constant $\tau_1$ is the product of the capacitance value $C_{CFm}$ of the filter capacitor CFm and the resistance value $R_{RBm}$ of the balance resistance RBm; that is, T1=(3~5)$\tau_1$=(3~5) ($C_{CFm} \times R_{RBm}$).

If the connection between the cell CELLm and the battery management system 120 is inoperative when the balance switch SWm is turned on, then the balance switch SWm, the balance resistor RBm and the filter capacitor CFm form a discharge circuit. After the first time period T1 ends, the voltage difference $V_{Tm}$ between the node BATm and the node BAT(m−1) can be decreased to 0V or close to 0V (for m=2, 3, . . . , N). For m=1, $V_{T1}$ represents the voltage value $V_{BAT1}$ of the node BAT1 relative to a ground.

In an embodiment, the length of the second time period T2 is set to be long enough so that, when the connection between the cell CELLm and the battery management system 120 is operative, the filter capacitor CFm can charge fully in the second time period T2, so the voltage difference $V_{Tm}$ between the node BATm and the node BAT(m−1) can return to the operating voltage $V_{CELLm}$ of the cell CELLm. Specifically, according to the properties of a discharge circuit of a resistor-capacitor (RC), when a charging time of a capacitor is three to five times a time constant, the capacitor will be charged fully. Therefore, the second time period T2 is set so that it is three to five times a second time constant $\tau_2$. The second time constant $\tau_2$ is the product of the capacitance value $C_{CFm}$ of the filter capacitor CFm and the sum of the resistance value $R_{RFm}$ of the monitoring resistance RFm and the resistance value $R_{RF(m-1)}$ of the monitoring resistance RF(m−1). That is, T2=(3~5)$\tau_2$=(3~5) ($C_{CFm} \times (R_{RFm}+R_{RF(m-1)})$), where, m=2, 3, . . . , N.

If the connection between the cell CELLm and the battery management system 120 is operative when the balance switch SWm is turned off, then the cell CELLm, the filter capacitor CFm, the monitoring resistor RFm and the monitoring resistor RF(m−1) form a charge circuit. The cell CELLm charges the filter capacitor CFm. After the second time period T2 ends, the voltage difference $V_{Tm}$ between the node BATm and the node BAT(m−1) can recover to the operating voltage $V_{CELLm}$ of the cell CELLm (for m=2, 3, . . . , N).

When m=1, if the connection between the cell CELL1 and the battery management system 120 is operative when the balance switch SW1 is turned off, then the cell CELL1, the filter capacitor CF1 and the monitoring resistor RF1 form a charge circuit. The cell CELL1 charges the filter capacitor CF1. After the second time period T2 ends, the voltage difference $V_{T1}$ between the node BAT1 and a ground can recover to the operating voltage $V_{CELL1}$ of the cell CELL1.

If the connection between the cell CELLm and the battery management system 120 is inoperative, then the cell CELLm and the filter capacitor CFm cannot form a charge circuit. Therefore, the voltage difference $V_{Tm}$ between the node BATm and the node BAT(m−1) can be maintained at the preset voltage value (e.g., 0V) at the end of the first time period T1.

The first open cell threshold $V_{CTO1}$ is set according to the minimum operating voltage of each battery unit. As described above, if the connection between the cell CELLm and the battery management system 120 is inoperative at the end of the second time period T2, the voltage difference $V_{Tm}$ between the node BATm and the node BAT(m−1) is at or close to the preset voltage value (e.g., 0V). If the connection between the cell CELLm and the battery management system 120 is operative at the end of the second time period T2, the voltage difference $V_{Tm}$ between the node BATm and the node BAT(m−1) is the operating voltage $V_{CELLm}$ of the cell CELLm. Therefore, to accurately determine whether the connection between the cell CELLm and the battery management system 120 is inoperative in the third time period T3, the first open cell threshold $V_{CTO1}$ is set to be higher than the preset voltage value and lower than the operating voltage $V_{CELLm}$ of the cell CELLm. To ensure accuracy, the operating voltage $V_{CELLm}$ of the cell CELLm is the cell's minimum operating voltage. That is, the first open cell threshold $V_{CTO1}$ is selected so that it is between the preset voltage value and the minimum operating voltage of the cell CELLm (e.g., between 0V and 2V). In an embodiment, the first open cell threshold $V_{CTO1}$ is 1V.

The second open cell threshold $V_{CTO2}$ is set according to the maximum operating voltage of the cell CELL(m+1) and the preset value $V_{SET}$ clamped by the zener diode D(m+1). If the connection between the cell CELL(m+1) and the battery management system 120 is operative at the end of the second time period T2, the voltage difference $V_{T(m+1)}$ between the node BAT(m+1) and the node BATm is the operating voltage $V_{CELL(m+1)}$ of the cell CELL(m+1). That is, $V_{T(m+1)}=V_{CELL(m+1)}$. Because $V_{CELL(m+1)}<V_{SET}$, the zener diode D(m+1) does not break down. If the connection between the cell CELLm and the battery management system 120 is inoperative at the end of the second time period T2, then the voltage difference $V_{T(m+1)}$ between the node BAT(m+1) and the node BATm is changed to $V_{CELLm}+V_{CELL(m+1)}$. Because $V_{CELLm}+V_{CELL(m+1)}$ can be greater than the preset value $V_{SET}$, the zener diode D(m+1) can break down. If the zener diode D(m+1) breaks down, then $V_{T(m+1)}=V_{SET}$. If the zener diode D(m+1) does not break down, then $V_{T(m+1)}=V_{CELLm}+V_{CELL(m+1)}$. Therefore, to accurately determine whether the connection between the cell CELLm and the battery management system 120 is inoperative, it is necessary to determine whether the zener diode D(m+1) has broken down. The second open cell threshold $V_{CTO2}$ is set between the operating voltage $V_{CELL(m+1)}$ of the cell CELL(m+1) and the preset value $V_{SET}$ clamped by the zener diode D(m+1). To ensure accuracy, the operating voltage $V_{CELL(m+1)}$ of the cell CELL(m+1) is the cell's maximum operating voltage. That is, the second open cell threshold $V_{CTO2}$ is selected so that it is between the preset value $V_{SET}$ and the maximum operating voltage of the cell CELL(m+1) (e.g., between 4.2V and 6V). In an embodiment, the second open cell threshold $V_{CTO2}$ is 4.8V.

In addition, as described above, the maximum value of the first open cell threshold $V_{CTO1}$ can be the minimum operating voltage of the cell CELLm, and the minimum value of the second open cell threshold $V_{CTO2}$ can be the maximum operating voltage of the cell CELL(m+1). Because the operating voltage of the cell CELLm is equal to that of the cell CELL(m+1), the second open cell threshold $V_{CTO2}$ is greater than the first open cell threshold $V_{CTO1}$.

Continuing with reference to FIG. 4, operation when the connection between the cell CELLm and the battery management system 120 is operative will now be described, for a case in which the voltage difference $V_{Tm}$ between the node BATm and the node BAT(m−1) is close to the operating voltage $V_{CELLm}$ of the cell CELLm before the control unit 127 transmits the open cell detection signal EN.

The balance switch SWm is turned on according to the open cell detection signal EN transmitted by the control unit 127, and the balance switch SWm, the balance resistor RBm and the filter capacitor CFm form a discharge circuit. The filter capacitor CFm starts to discharge and the voltage difference $V_{Tm}$ between the node BATm and the node BAT(m−1) decreases gradually from the value of $V_{CELLm}$. After the balance switch SWm is turned on for the first time period T1, the filter capacitor CFm no longer discharges and enters a stable state. That is, when the voltage difference $V_{Tm}$ decreases to a certain value (e.g., $R_{RBm} \times V_{CELLm}/(R_{RF(m-1)}+R_{RFm}+R_{RBm})$), it remains unchanged. $R_{RBm}$ represents the resistance value of the balance resistor RBm, $V_{CELLm}$ represents the operating voltage of the cell CELLm, $R_{RF(m-1)}$ represents the resistance value of the monitoring resistor RF(m−1), and $R_{RFm}$ represents the resistance value of the monitoring resistor RFm, for m=2, 3, . . . , N. If m=1, when the voltage difference $V_{T1}$ decreases to $V_{T1}=R_{RB1} \times V_{CELL1}/(R_{RF1}+R_{RB1})$, it remains unchanged. $R_{RB1}$ represents the resistance value of the balance resistor RB1, $V_{CELL1}$ represents the operating voltage of the cell CELL1, and $R_{RF1}$ represents the resistance value of the monitoring resistor RF1.

At the end of the first time period T1, the balance switch SWm is turned off. In this example, the connection between the cell CELLm and the battery management system 120 is operative, and so the cell CELLm, the filter capacitor CFm, the monitoring resistor RFm and the monitoring resistor RF(m−1) form a charge circuit. The cell CELLm starts to charge the filter capacitor CFm, and the voltage difference $V_{Tm}$ increases gradually. After the balance switch SWm is turned off for a second time period T2, the voltage difference $V_{Tm}$ returns to the operating voltage $V_{CELLm}$ of the cell CELLm.

At the end of the second time period T2, the first switch Km and the third switch S(m+1) are turned on simultaneously. The under-voltage comparator UVm compares the voltage difference $V_{Tm}$ that it receives with the first open cell threshold $V_{CTO1}$. Because $V_{Tm}=V_{CELLm}$, then $V_{Tm}>V_{CTO1}$, and the under-voltage comparator UVm outputs a low level "0". Meanwhile, the over-voltage comparator OV(m+1) compares the voltage difference $V_{T(m+1)}$ that it receives with the second open cell threshold $V_{CTO2}$. Because the connection between the cell CELLm and the battery management system 120 is operative, $V_{T(m+1)}=V_{CELL(m+1)}$. However, $V_{CELL(m+1)}<V_{CTO2}$, and so the over-voltage comparator OV(m+1) outputs a low level "0". The OR gate OR1 and the OR gate OR2 receive the low levels "0" output by the under-voltage comparator UVm and the over-voltage comparator OV(m+1), and also output the low level "0" after the OR operation. That is, the connection between the cell CELLm and the battery management system 120 is determined to be operative.

Operation when the connection between the cell CELLm and the battery management system 120 is inoperative will now be described, assuming that the voltage difference $V_{Tm}$ between the node BATm and the node BAT(m−1) is the operating voltage $V_{CELLm}$ of the cell CELLm before the control unit 127 transmits the open cell detection signal EN.

The balance switch SWm is turned on according to the open cell detection signal EN transmitted by the control unit 127, and the balance switch SWm, the balance resistor RBm and the filter capacitor CFm form a discharge circuit. The filter capacitor CFm starts to discharge and the voltage difference $V_{Tm}$ between the node BATm and the node BAT(m−1) decreases gradually from the value of $V_{CELLm}$. After the balance switch SWm is turned on for the first time period T1, the voltage difference $V_{Tm}$ decreases to the preset voltage value (e.g., 0V).

At the end of the first time period T1, the balance switch SWm is turned off. Because the connection between the cell CELLm and the battery management system 120 is inoperative, the cell CELLm does not charge the filter capacitor CFm, and the voltage difference $V_{Tm}$ cannot increase from 0V. After the balance switch SWm is turned off for the second time period T2, the voltage difference $V_{Tm}$ thus remains at the preset voltage value (e.g., 0V).

At the end of the second time period T2, the first switch Km is turned on. The under-voltage comparator UVm compares the voltage difference $V_{Tm}$ that it receives with the first open cell threshold $V_{CTO1}$. Because the voltage difference $V_{Tm}$ is at the preset voltage value (e.g., 0V), $V_{Tm}<V_{CTO1}$, and the under-voltage comparator UVm outputs a high level "1".

Because the connection between the cell CELLm and the battery management system 120 is inoperative, the voltage difference $V_{T(m+1)}$ between the node BAT(m+1) and the node BATm changes to $V_{CELLm}+V_{CELL(m+1)}$. Because $V_{CELLm}+V_{CELL(m+1)}$ may be larger than the preset value $V_{SET}$, the zener diode D(m+1) can break down. If the zener diode D(m+1) breaks down, then $V_{T(m+1)}=V_{SET}$, and a current will flow from the negative electrode of the zener diode D(m+1) to the positive electrode of the zener diode D(m+1), then to the node BATm, which pulls up the voltage $V_{BATm}$ at the node BATm. Because $V_{Tm}=V_{BATm}-V_{BAT(m-1)}$, the voltage difference $V_{Tm}$ is also pulled up. At the end of the second time period T2, the voltage difference $V_{Tm}$ can be greater than the first open cell threshold $V_{CTO1}$, which may lead to incorrectly determining the status of the connection between the cell CELLm and the battery management system 120.

In order to avoid that, the third switch S(m+1) and the first switch Km are turned on simultaneously. The over-voltage comparator OV(m+1) compares the voltage difference $V_{T(m+1)}$ that it receives with the second open cell threshold $V_{CTO2}$. If the zener diode D(m+1) does not break down, then the voltage difference $V_{T(m+1)}$ is $V_{CELLm}+V_{CELL(m+1)}$ (CTO) or $V_{CELL(m+1)}$ (the normal connection). Because the $V_{CELL(m+1)}$ is lower than the second open cell threshold $V_{CTO2}$, the over-voltage comparator OV(m+1) outputs a low level "0". If the zener diode D(m+1) breaks down, then the voltage difference $V_{T(m+1)}=V_{SET}>V_{CTO2}$, and the over-voltage comparator OV(m+1) outputs a high level "1". That is, the voltage $V_{BATm}$ at the node BATm is pulled up, and the voltage difference $V_{Tm}$ is also pulled up. The present invention eliminates the potential for error caused by the breakdown of the zener diode D(m+1). That is, even if the zener diode D(m+1) breaks down when the connection between the cell CELLm and the battery management system 120 is inoperative, the voltage difference $V_{Tm}$ is pulled up. The voltage difference $V_{Tm}$ after it is pulled up may be greater than the first open cell threshold $V_{CTO1}$, which can lead to an incorrect output from the under-voltage comparator UVm if not accounted for. To avoid that, after the comparison of the over-voltage comparator OV(m+1), the over-voltage comparator OV(m+1) outputs a high level "1" to the judging unit 126. The judging unit 126 also outputs a high level "1" after the OR operation. Thus, it can be correctly determined that the connection between the cell CELLm and the battery management system 120 is inoperative.

In the above examples, both the OR gate OR1 and the OR gate OR2 perform the OR operation on the levels output by the under-voltage comparator UVm and the high level "1" output by the over-voltage comparator OV(m+1), and output a high level "1". Thus, it can be correctly determined that the connection between the cell CELLm and the battery management system 120 is inoperative.

The values for the first time period T1, the second time period T2, the first open cell threshold $V_{CTO1}$ and the second open cell threshold $V_{CTO2}$ are sufficient, which can be demonstrated using the cell CELL1 as an example. For CELL1, $R_{RF1}$=10 kΩ, $C_{CF1}$=0.1 μF, $R_{RB1}$=1000, $V_{OV}$=4.2V, $V_{UV}$=2V, $V_{SET}$=6V, $V_{CTO1}$=1V, and $V_{CTO2}$=4.8V. $R_{RF1}$ represents the resistance value of the monitoring resistor $R_{RF1}$, $C_{CF1}$ represents the capacitance value of the filter capacitor $C_{CF1}$, $R_{RB1}$ represents the resistance value of the balance resistor $R_{RB1}$, $V_{OV}$ represents the over-voltage threshold, $V_{UV}$ represents the under-voltage threshold, $V_{SET}$ represents the preset value, $V_{CTO1}$ represents the first open cell threshold, and $V_{CTO2}$ represents the second open cell threshold.

The first time period T1=(3~5)τ$_1$32 (3~5)($C_{OF1}$×$R_{RB1}$). Substituting the above values into that equation, the first time period T1 is determined to between 30 μs and 50 μs. In an embodiment, the first time period T1 is chosen to be 50 μs. The first time period T1 ensures that the filter capacitor CF1 has sufficient discharge time. Also, if the connection between the cell CELL1 and the battery management system 120 is inoperative, then the voltage difference $V_{T1}$ between the node BAT1 and the ground is 0V at the end of the first time period T1.

The second time period T2=(3~5)τ$_2$=(3~5)($C_{CF1}$×$R_{RF1}$). Substituting the above values into that equation, the second time period T2 is determined to be between 6 ms and 10 ms. In an embodiment, the second time period T2 is chosen to be 10 ms. The second time period T2 ensures that the filter capacitor CF1 has sufficient charge time. Also, if the connection between the cell CELL1 and the battery management system 120 is operative, then the voltage difference $V_{T1}$ between the node BAT1 and the ground is the operating voltage $V_{CELL1}$ of the cell CELL1 at the end of the second time period T2.

In an embodiment, the operating voltage $V_{CELL1}$ of the cell CELL1 is 2V (the minimum operating voltage of the cell CELL1). If the connection between the cell CELL1 and the battery management system 120 is inoperative, then $V_{CELL1}$+$V_{CELL2}$=4V<$V_{SET}$, and the zener diode D2 does not break down. At the end of the second time period T2, $V_{T1}$=0V, and $V_{T2}$=4V. Therefore, $V_{T1}$=0V<$V_{CTO1}$=1V, and $V_{T2}$=4V<$V_{CTO2}$=4.8V. The under-voltage comparator UV1 outputs a high level "1" to the judging unit 126 and the over-voltage comparator OV2 outputs a low level "0" to the judging unit 126. The judging unit 126 performs the OR operation and outputs a high level "1". Thus, it can be determined that the connection between the cell CELL1 and the battery management system 120 is inoperative.

If the connection between the cell CELL1 and the battery management system 120 is operative, then at the end of the second time period T2, $V_{T1}$=2V, and $V_{T2}$=2V. Therefore, $V_{T1}$=2V>$V_{CTO1}$=1V, and $V_{T2}$=2V<$V_{CTO2}$=4.8V. Therefore, both the under-voltage comparator UV1 and the over-voltage comparator OV2 output a low level "0" to the judging unit 126. The judging unit 126 performs the OR operation and outputs a low level "0". Thus, it can be determined that the connection between the cell CELL1 and the battery management system 120 is operative.

In an embodiment, the operating voltage $V_{CELL1}$ of the cell CELL1 is 4.2V (the maximum operating voltage of the cell CELL1). If the connection between the cell CELL1 and the battery management system 120 is inoperative, then $V_{CELL1}$+$V_{CELL2}$=8.4V>$V_{SET}$, and the zener diode D2 can break down. If the zener diode D2 breaks down, then at the end of the second time period T2, $V_{T1}$=4.2V+4.2V−6V=2.4V, and $V_{T2}$=6V. Therefore, $V_{T1}$=2.4V>$V_{CTO1}$=1V, and $V_{T2}$=6V>$V_{CTO2}$=4.8V. The under-voltage comparator UV1 outputs a low level "0" to the judging unit 126 and the over-voltage comparator OV2 outputs a high level "1" to the judging unit 126. The judging unit 126 performs the OR operation and outputs a high level "1". Thus, it can be determined that the connection between the cell CELL1 and the battery management system 120 is inoperative. If, on the other hand, the zener diode D2 does not break down, then at the end of the second time period T2, $V_{T1}$=0V, and $V_{T2}$=8.4V. Therefore, $V_{T1}$=0V<$V_{CTO1}$=1V, and $V_{T2}$=8.4V>$V_{CTO2}$=4.8V. The under-voltage comparator UV1 outputs a high level "1" to the judging unit 126 and the over-voltage comparator OV2 outputs a high level "1" low level "0" to the judging unit 126. The judging unit 126 performs the OR operation and outputs a high level "1". Thus, it can be determined that the connection between the cell CELL1 and the battery management system 120 is inoperative.

If the connection between the cell CELL1 and the battery management system 120 is operative, then at the end of the second time period T2, $V_{T1}$=4.2V, and $V_{T2}$=4.2V. Therefore, $V_{T1}$=4.2V>$V_{CTO1}$, and $V_{T2}$=4.2V<$V_{CTO2}$. Therefore, both the under-voltage comparator UV1 and the over-voltage comparator OV2 output a low level "0" to the judging unit 126. The judging unit 126 performs the OR operation and outputs a low level "0". Thus, it can be determined that the connection between the cell CELL1 and the battery management system 120 is operative.

Figure 5A:
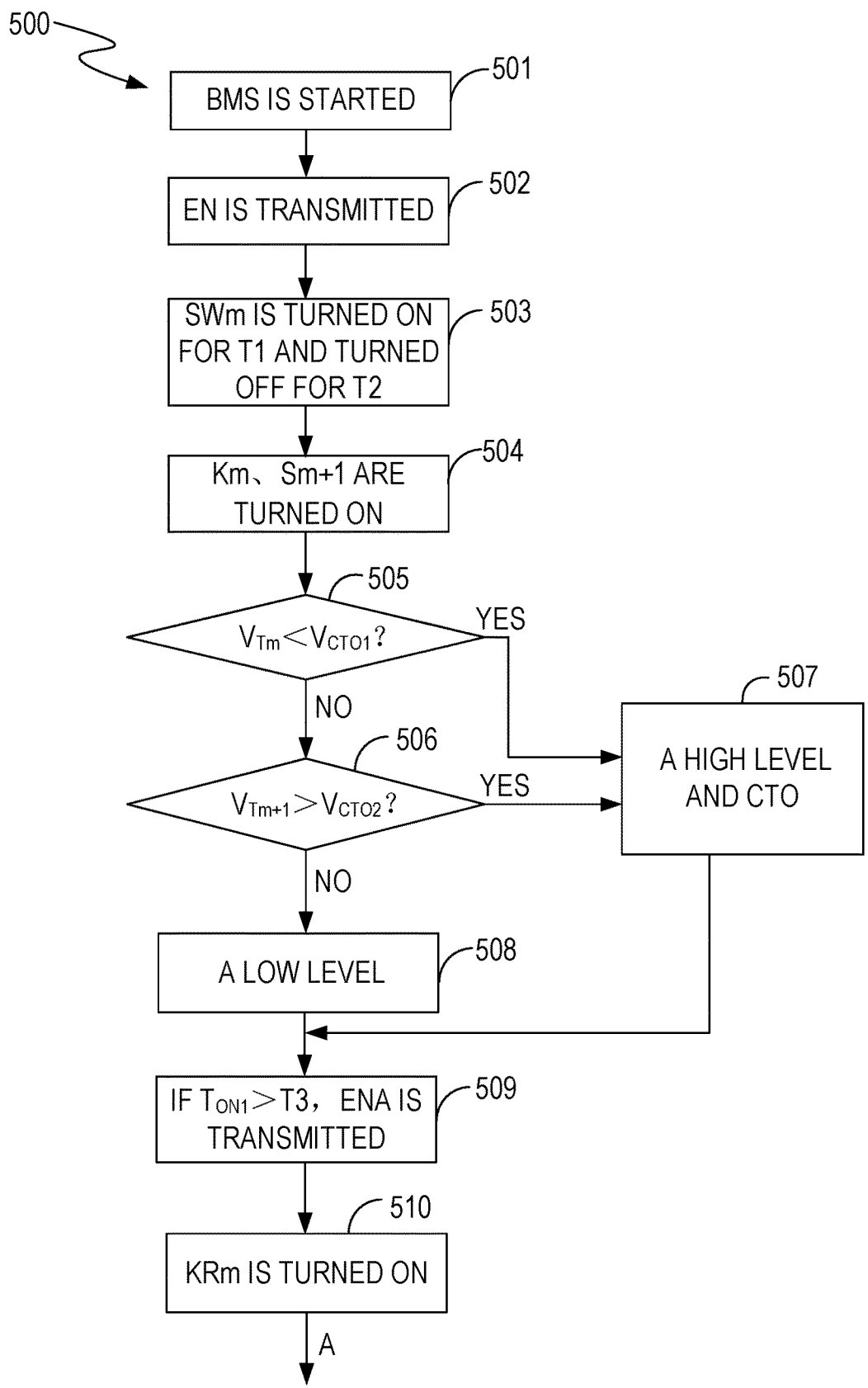
FIG. 5A, FIG. 5B and FIG. 5C show a flowchart of an open cell detection method in a battery management system, in accordance with embodiments of the present invention.
Figure 5B:
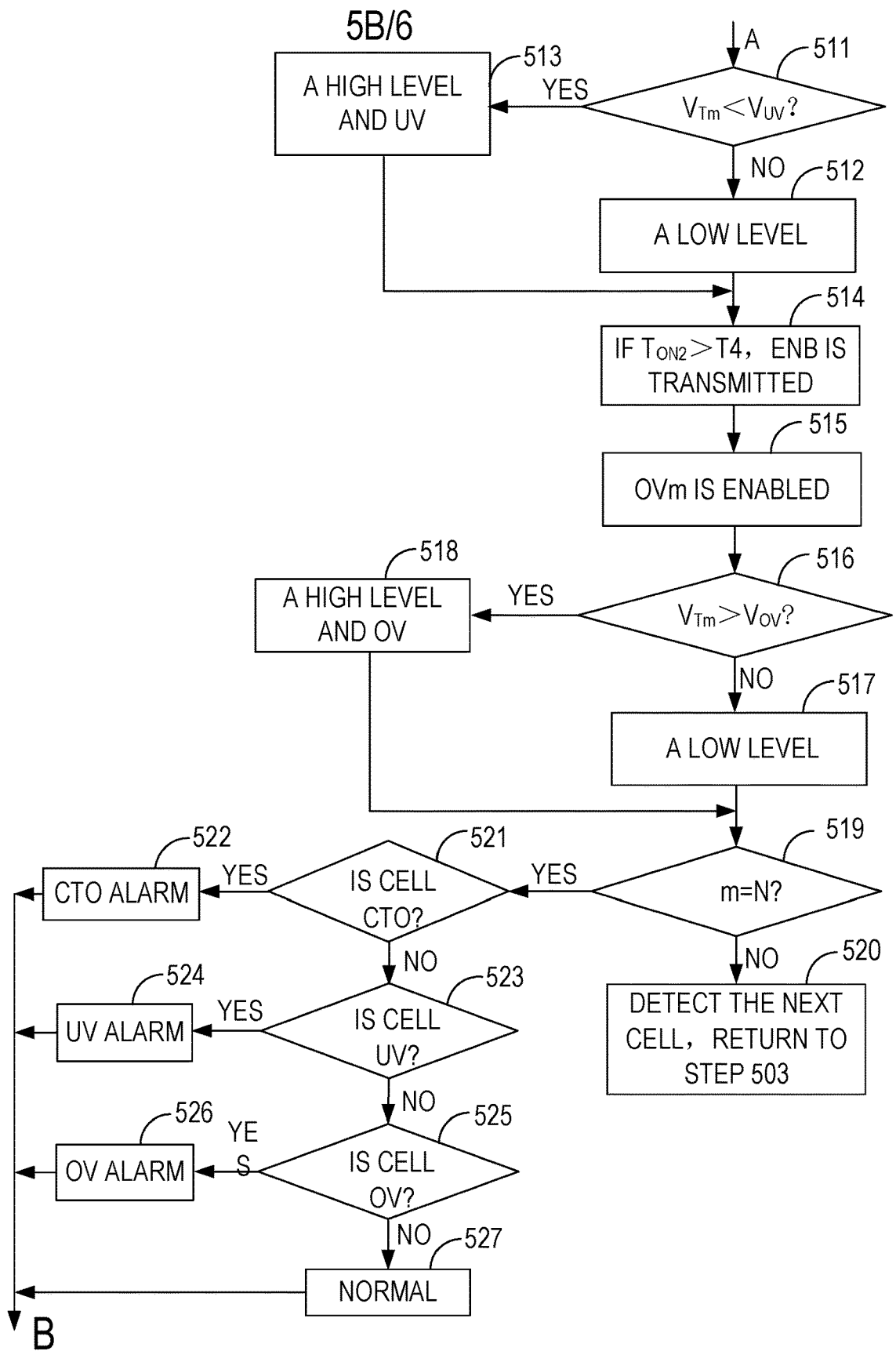
Figure 5C:
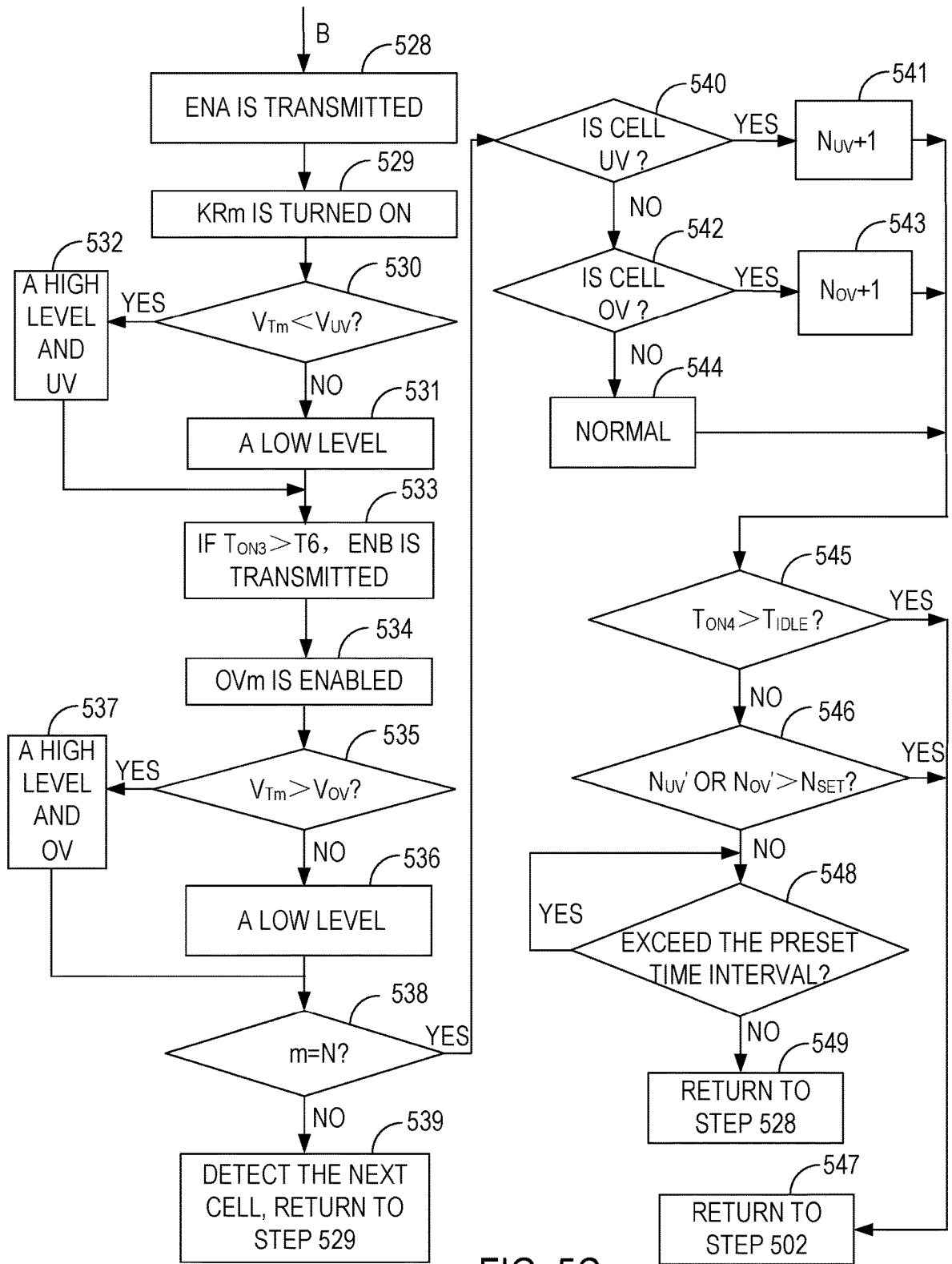

FIG. 5A, FIG. 5B and FIG. 5C show a flowchart of an open cell detection method 500 in a battery management system 120, in accordance with embodiments of the present invention. FIG. 5A, FIG. 5B and FIG. 5C are described in conjunction with FIG. 2 and FIG. 3.

In an embodiment, a first cycle of the open cell detection, the under-voltage detection and the over-voltage detection operations are performed successively on the cell CELL1, the cell CELL2, ..., the cell CELLN, in that order. After a preset idle time period $T_{IDLE}$, a second cycle of the open cell detection, the under-voltage detection and the over-voltage detection operations are started. Meanwhile, the control unit 127 transmits a detection signal to perform the under-voltage detection and the over-voltage detection operations every preset time interval in the idle time period $T_{IDLE}$. Thus, the control unit 127 can perform multiple under-voltage or over-voltage detection operations in the idle time period $T_{IDLE}$. Each under-voltage or over-voltage detection operation can determine whether an under-voltage or over-voltage failure is occurring. If the number of under-voltage failures $N_{UV}$ or over-voltage failures $N_{OV}$ is greater than a preset number $N_{SET}$, the open cell detection, the under-voltage detection and the over-voltage detection operations can be performed again, to avoid inaccurate under-voltage (UV) and over-voltage (OV) results caused by an open cell failure (Cell Tap Open, CTO). In another embodiment, the open cell detection operation can be performed in the third time period T3, the over-voltage detection operation can be performed in the fourth time period T4, and the under-voltage detection operation can be performed in the fifth time period T5.

In step 501, the battery management system 120 is started.

In step 502, at time t1, the control unit 127 transmits an open cell detection signal EN. The open cell detection signal EN indicates the order for performing the open cell detection operation. In an embodiment, the open cell detection is performed in the following order: the cell CELL1, the cell CELL2, ..., the cell CELLN.

In step 503, according to the order specified by the open cell detection signal EN, the balance switch SWm is turned on for the first time period T1, and then is turned off for the second time period T2.

In step 504, at the end of the second time period T2, the first switch Km and the third switch S(m+1) are turned on simultaneously according to the order indicated by the open cell detection signal EN.

In step 505, the inverting input terminal "−" of the under-voltage comparator UVm receives a voltage difference $V_{Tm}$ between a node BATm and a node BAT(m−1). The under-voltage comparator UVm compares the voltage difference $V_{Tm}$ with the first open cell threshold $V_{CTO1}$ and outputs a comparison result in the third time period T3. When the voltage difference $V_{Tm}$ is not less than the first open cell threshold $V_{CTO1}$, the under-voltage comparator UVm outputs a low level "0", and step 505 is followed by step 506. Otherwise, step 505 is followed by step 507.

In step 506, the non-inverting input terminal "+" of the over-voltage comparator OV(m+1) receives a voltage difference $V_{T(m+1)}$ between a node BAT(m+1) and the node BATm. The over-voltage comparator OV(m+1) compares the voltage difference $V_{T(m+1)}$ with the second open cell threshold $V_{CTO2}$ and outputs a comparison result in the third time period T3. When the voltage difference $V_{T(m+1)}$ is greater than the second open cell threshold $V_{CTO2}$, the over-voltage comparator OV(m+1) outputs a high level "1", and step 506 is followed by step 507. Otherwise, step 506 is followed by step 508.

In step 507, the judging unit 126 (e.g., the OR gate OR1 and the OR gate OR2) performs the OR operation on the high level "1" output by the under-voltage comparator UVm and outputs a high level "1". Alternatively, the judging unit 126 performs the OR operation on the low level "0" output by the under-voltage comparator UVm and the high level "1" output by the over-voltage comparator OV(m+1), and outputs a high level "1". The high level "1" output by the judging unit 126 indicates that the connection between the cell CELLm and the battery management system 120 is inoperative. That is, a CTO is in the cell CELLm. Then, step 507 is followed by step 509.

In step 508, the judging unit 126 (e.g., the OR gate OR1 and the OR gate OR2) performs the OR operation on the low level "0" output by the under-voltage comparator UVm in the third time period T3 and the low level "0" output by the over-voltage comparator OV(m+1) in the third time period T3, and outputs a low level "0". The low level "0" output by the judging unit 126 indicates that the connection between the cell CELLm and the battery management system 120 is operative. Then, step 508 is followed by step 509.

In step 509, after the length of the turn-on time $T_{ON1}$ of the first switch Km and the third switch S(m+1) is longer than the third time period T3, the control unit 127 transmits an under-voltage detection signal ENA. All of the cells are checked during the under-voltage detection operation according to the order indicated by the under-voltage detection signal ENA.

In step 510, the second switch KRm is turned on in response to the under-voltage detection signal ENA.

In step 511, the inverting input terminal "−" of the under-voltage comparator UVm receives a voltage difference $V_{Tm}$ between the node BATm and the node BAT(m−1). The under-voltage comparator UVm compares the voltage difference $V_{Tm}$ with an under-voltage threshold $V_{UV}$ and outputs a comparison result in the fourth time period T4. When the voltage difference $V_{Tm}$ is not less than the under-voltage threshold $V_{UV}$, the under-voltage comparator UVm outputs a low level "0", and step 511 is followed by step 512. Otherwise, step 511 is followed by step 513.

In step 512, the OR gate OR3 receives the low level "0" output from the under-voltage comparator UVm in the fourth time period T4. This indicates that the operating voltage of the cell CELLm is in the normal state. Step 512 then proceeds to step 514.

In step 513, the OR gate OR3 receives the high level "1" output from the under-voltage comparator UVm in the fourth time period T4. This indicates that the operating voltage of the cell CELLm is in the under-voltage state. That is, an under-voltage failure has occurred in the cell CELLm. Step 513 then proceeds to step 514.

In step 514, after the length of the turn-on time $T_{ON2}$ of the second switch KRm is longer than the fourth time period T4, the control unit 127 transmits an over-voltage detection signal ENB. All of the cells are checked during the over-voltage detection operation according to the order indicated by the over-voltage detection signal ENB.

In step 515, the over-voltage comparator OVm is enabled in response to the over-voltage detection signal ENB.

In step 516, the inverting input terminal "−" of the over-voltage comparator OVm receives the voltage difference $V_{Tm}$ between the node BATm and the node BAT(m−1). The over-voltage comparator OVm compares the voltage difference $V_{Tm}$ with the over-voltage threshold $V_{OV}$ and outputs a comparison result. When the voltage difference $V_{Tm}$ is not greater than the over-voltage threshold $V_{OV}$, the over-voltage comparator OVm outputs a low level "0", and step 516 is followed by step 517. Otherwise, step 516 is followed by step 518.

In step 517, the OR gate OR4 receives the low level "0" output from the over-voltage comparator OVm in the fifth time period T5. This indicates that the operating voltage of the cell CELLm is in the normal state. Step 517 then proceeds to step 519.

In step 518, the OR gate OR4 receives the high level "1" output from the over-voltage comparator OVm in the fifth time period T5. This indicates that the operating voltage of the cell CELLm is in the over-voltage state. That is, an over-voltage failure has occurred in the cell CELLm. Step 518 then proceeds to step 519.

In step 519, an operation is performed to determine whether m is equal to N. If not, then step 519 is followed by step 520. Otherwise, step 519 is followed by step 521.

In step 520, the next cell is selected and the method returns to step 503.

In step 521, because the priority of open cell detection is higher than that for under-voltage detection and over-voltage detection, the judging unit 126 (the OR gate OR1 and the OR gate OR2) performs the OR operation first on signals (high level "1" or low level "0") output by the under-voltage comparators UVm (m=1, 2, . . . , N) and the over-voltage comparators OVm (m=2, 3, . . . , N) in the third time period T3. If the operation result is the high level "1", this indicates that a connection between a cell and the battery management system 120 is inoperative. That is, a CTO has occurred in the cells. Step 521 then proceeds to step 522. If the operation result is the low level "0", this indicates that the connections between the cells in the battery units 110 and the battery management system 120 are operative, and step 521 then proceeds to step 523.

In step 522, the control unit 127 receives the high level "1" and transmits an open cell alarm. At the same time, the control unit 127 disconnects the cells from the load and the charger. Then, step 522 proceeds to step 528.

In step 523, the control unit 127 receives the low level "0", indicating that the connections between cells in the battery units 110 and the battery management system 120 are operative. At the same time, the OR gate OR3 performs the OR operation on the signals it receives (high level "1" or low level "0") from the under-voltage comparators UVm in the fourth time period T4. If the operation result is the high level "1", this indicates that the operating voltage of a cell is in the under-voltage state. That is, an under-voltage failure has occurred in the cells in the battery units 110. Step 523 then proceeds to step 524. If the operation result is the low level "0", this indicates that the operating voltages of the cells in the battery units 110 are in the normal state, and step 523 proceeds to step 525.

In step 524, the control unit 127 receives the high level "1" and transmits an under-voltage alarm. At the same time, the control unit 127 performs the under-voltage protection operation. That is, the control unit 127 disconnects the cells in the battery units 110 from the load. Then, step 524 proceeds to step 528.

In step 525, the OR gate OR4 performs the OR operation on the signals it receives (high level "1" or low level "0") from the over-voltage comparators OVm in the fifth period T5. If the operation result is the high level "1", this indicates that the operating voltage of a cell in the battery units 110 is in the over-voltage state. That is, an over-voltage failure has occurred in the cells. Step 525 then proceeds to step 526. If the operation result is the low level "0", this indicates that the operating voltages of the cells in the battery units 110 are in the normal state, and step 525 proceeds to step 527.

In step 526, the control unit 127 receives the high level "1" and transmits an over-voltage alarm. At the same time, the control unit 127 performs the over-voltage protection operation. That is, the control unit 127 disconnects the cells in the battery units 110 from the charger. Then, step 526 proceeds to step 528.

In step 527, the operation results of the judging unit 126 (the OR gate OR1 and the OR gate OR2), the OR gate OR3 and the OR gate OR4 are the high level "1". The control unit 127 determines that the operating voltages of the cells in the battery units 110 are in the normal state. That is, the connections between the cells in the battery units 110 and the battery management system 120 are operative and the operating voltages of cells are in the normal state. Step 527 then proceeds to step 528.

In step 528, after the first cycle of open cell detection, under-voltage detection and over-voltage detection are complete, the preset idle time period $T_{IDLE}$ is entered. The control unit 126 transmits the under-voltage detection signal ENA every preset time interval (e.g., 256 ms) in the idle time period $T_{IDLE}$.

In step 529, the second switch KRm is turned on in response to each under-voltage detection signal ENA.

In step 530, the inverting input terminal "−" of the under-voltage comparator UVm receives the voltage difference $V_{Tm}$ between the node BATm and the node BAT(m−1). The under-voltage comparator UVm compares the voltage difference $V_{Tm}$ with the under-voltage threshold $V_{UV}$ and outputs a comparison result in a sixth time period T6 (not shown in FIG. 3; the sixth time period T6 is for enabling each under-voltage comparator UVm to complete the comparison between the voltage difference $V_{Tm}$ and the under-voltage threshold $V_{UV}$, to output a comparison result). When the voltage difference $V_{Tm}$ is not less than the under-voltage threshold $V_{UV}$, the under-voltage comparator UVm outputs a low level "0", and step 530 is followed by step 531. Otherwise, step 530 is followed by step 532.

In step 531, the OR gate OR3 receives the low level "0" output by the under-voltage comparator UVm in the sixth time period T6. This indicates that the operating voltage $V_{CELLm}$ of the cell CELLm is in the normal state. Step 531 then proceeds to step 533.

In step 532, the OR gate OR3 receives the high level "1" output by the under-voltage comparator UVm in the sixth time period T6. This indicates that the operating voltage $V_{CELLm}$ of the cell CELLm is in the under-voltage state. That is, an under-voltage failure has occurred in the cell CELLm. Step 532 then proceeds to step 533.

In step 533, after the length of the turn-on time $T_{ON3}$ of the second switch KRm is longer than the sixth time period T6, the control unit 127 transmits the over-voltage detection signal ENB. All of the cells are checked during the over-voltage detection operation according to the order indicated by the over-voltage detection signal ENB.

In step 534, the over-voltage comparator OVm is enabled in response to the over-voltage detection signal ENB.

In step 535, the inverting input terminal "−" of the over-voltage comparator OVm (m=2, 3, ..., N) receives the voltage difference $V_{Tm}$ between the node BATm and the node BAT(m−1). The over-voltage comparator OVm compares the voltage difference $V_{Tm}$ with the over-voltage threshold $V_{OV}$ and outputs a comparison result in a seventh time period T7. The seventh time period T7 (not shown in FIG. 3) is for enabling each over-voltage comparator OVm (m=1, 2, ..., N) to complete the comparison between the voltage difference $V_{Tm}$ and the over-voltage threshold $V_{OV}$, to output a comparison result. When the voltage difference $V_{Tm}$ is not greater than the over-voltage threshold $V_{OV}$, the over-voltage comparator OVm outputs a low level "0", and step 535 is followed by step 536. Otherwise, step 535 is followed by step 537.

In step 536, the OR gate OR4 receives the low level "0" output from the over-voltage comparator OVm in the seventh time period T7. This indicates that the operating voltage $V_{CELLm}$ of the cell CELLm is in the normal state. Step 536 then proceeds to step 538.

In step 537, the OR gate OR4 receives the high level "1" output from the over-voltage comparator OVm in the seventh time period T7. This indicates that the operating voltage $V_{CELLm}$ of the cell CELLm is in the over-voltage state. That is, an over-voltage failure has occurred in the cell CELLm. Step 537 then proceeds to step 538.

In step 538, an operation is performed to determine whether m is equal to N. If not, then step 538 proceeds to step 539. Otherwise, step 538 proceeds to step 540.

In step 539, the next cell in the battery units 110 is selected, and the method 500 returns to step 529.

In step 540, the OR gate OR3 receives signals (high level "1" or low level "0) output by all of the under-voltage comparators and performs the OR operation in the sixth time period T6. If the operation result is the high level "1", this indicates that the operating voltage of a cell in the battery units 110 is in the under-voltage state. That is, an under-voltage failure has occurred in the cells in the battery units 110. Step 540 then proceeds to step 541. If the operation result is the low level "0", this indicates that the operating voltages of the cells in the battery units 110 are in the normal state, and step 540 proceeds to step 542.

In step 541, the number of under-voltage failures $N_{UV}$ is increased by one to obtain an updated number of under-voltage failures $N_{UV}'$. Step 541 then proceeds to step 545.

In step 542, the OR gate OR4 receives signals (high level "1" or low level "0") output from all of the over-voltage comparators and performs the OR operation in the seventh time period T7. If the operation result is the high level "1", this indicates that the operating voltage of a cell in the battery units 110 is in the over-voltage state. That is, an over-voltage failure has occurred in the cells in the battery units 110. Step 542 then proceeds to step 543. If the operation result is the low level "0", this indicates that the operating voltages of the cells in the battery units 110 are in the normal state, and step 542 proceeds to step 544.

In step 543, the number of over-voltage failures $N_{OV}$ is increased by one to obtain an updated number of over-voltage failures $N_{OV}'$. Step 543 then proceeds to step 545.

In step 544, the operation results of the OR gate OR3 and the OR gate OR4 are the low level "0". This indicates that the operating voltages of the cells in the battery units 110 are in the normal state. Step 544 then proceeds to step 545.

In step 545, it is determined whether the length of the time $T_{ON4}$ since entering the idle time period $T_{IDLE}$ is longer than the idle time period $T_{IDLE}$. If yes, step 545 is followed by step 547. Otherwise, step 545 is followed by step 546.

In step 546, an operation is performed to determine whether the number of under-voltage failures $N_{UV}'$ or the number of over-voltage failures $N_{OV}'$ is greater than a preset number $N_{SET}$. If yes, then step 546 is followed by step 547. Otherwise, step 546 is followed by step 548.

In step 547, the method 500 returns to step 502, and the next cycle of open cell detection, under-voltage detection and over-voltage detection is started.

In step 548, it is determined whether the length of time after the last under-voltage detection signal ENA was transmitted exceeds the preset time interval. If yes, step 548 is followed by step 549. Otherwise, time continues to be measured and recorded until the preset time interval (256 ms) is exceeded.

In step 549, the method 500 returns to step 528. That is, the next cycle of under-voltage detection and over-voltage detection is started.

Figure 6:
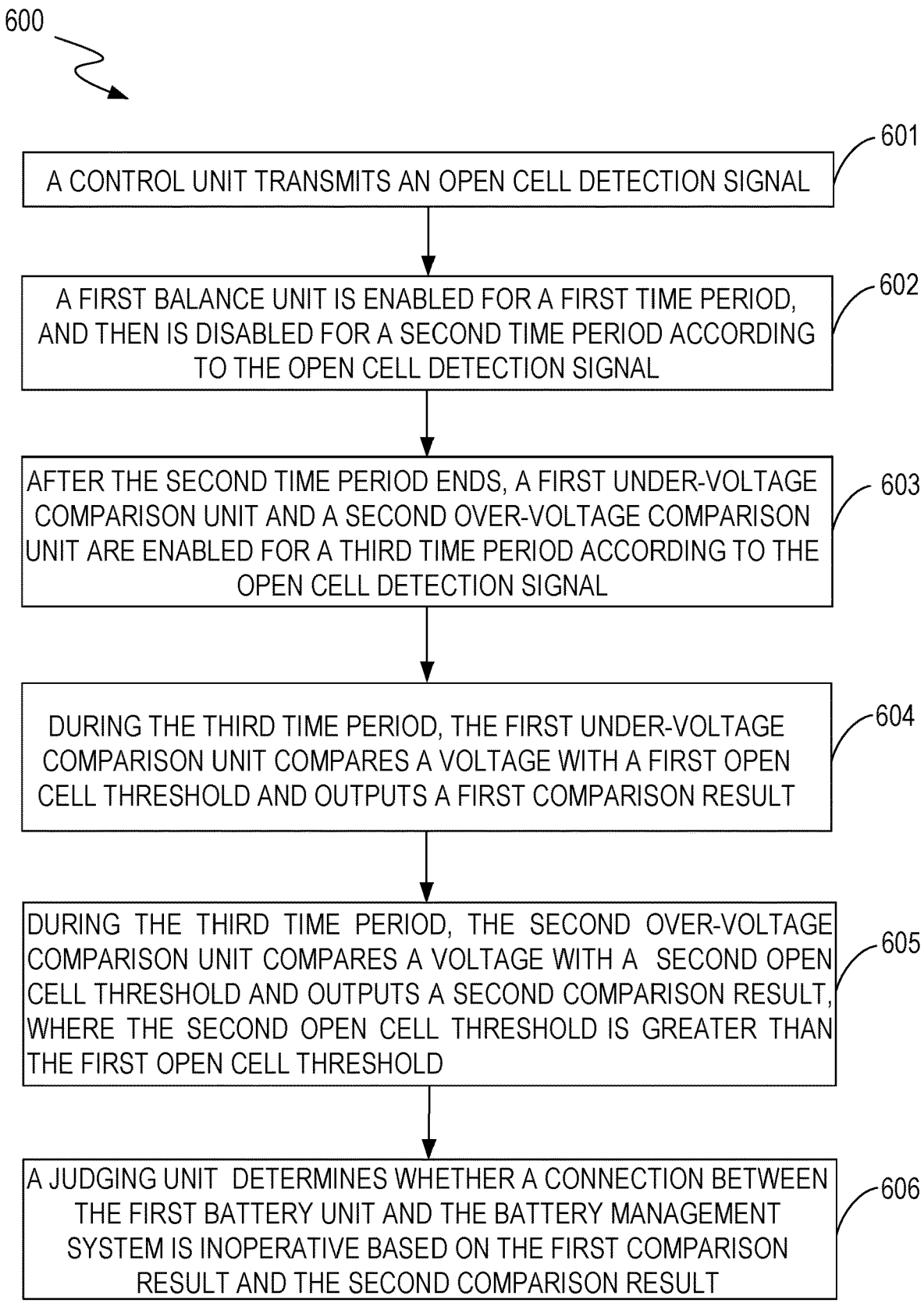
FIG. 6 shows a flowchart of an open cell detection method, in accordance with embodiments of the present invention.

FIG. 6 shows a flowchart of an open cell detection method 600, in accordance with embodiments of the present invention. FIG. 6 is described in conjunction with FIG. 1.

In step 601, a control unit 127 transmits an open cell detection signal EN.

In step 602, a first balance unit 122_1 is enabled for a first time period T1, and then is disabled for a second time period T2 according to the open cell detection signal EN.

In step 603, at the end of the second time period T2, a first under-voltage comparison unit 124_1 and a second over-voltage comparison unit 125_2 are enabled simultaneously for a third time period T3 according to the open cell detection signal EN.

In step 604, during the third time period T3, the first under-voltage comparison unit 124_1 compares a voltage that it receives with a first open cell threshold $V_{CTO1}$ and outputs a first comparison result.

In step 605, during the third time period T3, the second over-voltage comparison unit 125_2 compares a voltage that it receives with a second open cell threshold $V_{CTO2}$ and outputs a second comparison result. The second open cell threshold $V_{CTO2}$ is greater than the first open cell threshold $V_{CTO1}$.

In step 606, a judging unit 126 determines whether a connection between the first battery unit 110_1 and the battery management system 120 is inoperative based on the first comparison result and the second comparison result.

While the foregoing description and drawings represent embodiments of the present invention, it will be understood that various additions, modifications, and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A battery management system, comprising:
   a balance unit, coupled to a first battery unit, and configured to be enabled for a first time period and disabled for a second time period following said first time period;
   an under-voltage comparison unit, coupled to said balance unit, and configured to receive a first voltage between a first terminal and a second terminal in a third time period following said second time period, and also configured to compare said first voltage with a first open cell threshold to output a first comparison result, wherein said first terminal is coupled to a positive electrode of said first battery unit, and wherein said second terminal is coupled to a negative electrode of said first battery unit;
   an over-voltage comparison unit, coupled to a second battery unit that is coupled in series with and adjacent to said first battery unit, said over-voltage comparison unit configured to receive a second voltage between a third terminal and a fourth terminal in said third time period, and also configured to compare said second voltage with a second open cell threshold to output a second comparison result, wherein said third terminal is coupled to a positive electrode of said second battery unit, and wherein said fourth terminal is coupled to a negative electrode of said second battery unit and to said positive electrode of said first battery unit; and
   a judging unit, coupled to said under-voltage and over-voltage comparison units, and configured to determine whether a connection between said first battery unit and said battery management system is inoperative based on said first comparison result and said second comparison result.

2. The battery management system of claim 1, further comprising a filter capacitor coupled to said balance unit,
   wherein if said first battery unit is disconnected from said battery management system and said balance unit is enabled, then said filter capacitor discharges through said balance unit, and
   wherein if said first battery unit is connected to said battery management system and said balance unit is disabled, then said first battery unit charges said filter capacitor.

3. The battery management system of claim 2, wherein a length of said first time period is set so that said filter capacitor fully discharges in said first time period; and
   wherein a length of said second time period is set so that said filter capacitor fully charges in said second time period.

4. The battery management system of claim 1, further comprising a protection unit coupled to said second battery unit and configured to clamp a voltage provided from said second battery unit within a preset value.

5. The battery management system of claim 4, wherein said second open cell threshold is set according to said preset value and a maximum operating voltage of said second battery unit.

6. The battery management system of claim 1, wherein said first open cell threshold is set according to a minimum operating voltage of said first battery unit.

7. The battery management system of claim 1, wherein said under-voltage comparison unit is configured to compare said first voltage with an under-voltage threshold to output a third comparison result after said third time period, and wherein said third comparison result is used to determine whether said first battery unit is under voltage.

8. The battery management system of claim 1, wherein said over-voltage comparison unit is configured to compare said second voltage with an over-voltage threshold to output a fourth comparison result after said third time period, and wherein said fourth comparison result is used to determine whether said second battery unit is over voltage.

9. A method, comprising:
enabling a balance unit in a battery management system for a first time period, wherein said balance unit is coupled to a first battery unit;
disabling said balance unit for a second time period following said first time period;
receiving, using an under-voltage comparison unit, a first voltage between a first terminal and a second terminal in a third time period following said second time period, wherein said first terminal is coupled to a positive electrode of said first battery unit, and wherein said second terminal is coupled to a negative electrode of said first battery unit;
comparing, using said under-voltage comparison unit, said first voltage with a first open cell threshold to output a first comparison result;
receiving, using an over-voltage comparison unit, a second voltage between a third terminal and a fourth terminal in said third time period, wherein said third terminal is coupled to a positive electrode of a second battery unit, wherein said fourth terminal is coupled to a negative electrode of said second battery unit and said positive electrode of said first battery unit, and wherein said second battery unit is coupled in series with and adjacent to said first battery unit;
comparing, using said over-voltage comparison unit, said second voltage with a second open cell threshold to output a second comparison result; and
determining, using a judging unit, whether a connection between said first battery unit and said battery management system is inoperative based on said first comparison result and said second comparison result.

10. The method of claim 9, further comprising:
discharging, using said balance unit, a filter capacitor if said first battery unit is disconnected from said battery management system and said balance unit is enabled; and
charging, using said first battery unit, said filter capacitor if said first battery unit is connected to said battery management system and said balance unit is disabled.

11. The method of claim 10, wherein a length of said first time period is set so that said filter capacitor fully discharges in said first time period; and
wherein a length of said second time period is set so that said filter capacitor fully charges in said second time period.

12. The method of claim 9, further comprising:
clamping, using a protection unit coupled to said second battery unit, a voltage provided from said second battery unit within a preset value.

13. An open cell detection system, comprising:
a first battery unit;
a second battery unit coupled in series with and adjacent to said first battery unit; and
a battery management system, coupled to said first and second battery units, and comprising:
a balance unit, coupled to said first battery unit, and configured to be enabled for a first time period and disabled for a second time period following said first time period;
an under-voltage comparison unit, coupled to said balance unit, and configured to receive a first voltage between a first terminal and a second terminal in a third time period following said second time period, and also configured to compare said first voltage with a first open cell threshold to output a first comparison result, wherein said first terminal is coupled to a positive electrode of said first battery unit, and wherein said second terminal is coupled to a negative electrode of said first battery unit;
an over-voltage comparison unit, coupled to said second battery unit, and configured to receive a second voltage between a third terminal and a fourth terminal in said third time period, and also configured to compare said second voltage with a second open cell threshold to output a second comparison result, wherein said third terminal is coupled to a positive electrode of said second battery unit, and wherein said fourth terminal is coupled to a negative electrode of said second battery unit and to said positive electrode of said first battery unit; and
a judging unit, coupled to said under-voltage and over-voltage comparison units, and configured to determine whether a connection between said first battery unit and a battery management system is inoperative based on said first comparison result and said second comparison result.

14. The open cell detection system of claim 13, wherein said battery management system further comprising a filter capacitor coupled to said balance unit,
wherein if said first battery unit is disconnected from said battery management system and said balance unit is enabled, then said filter capacitor discharges through said balance unit, and
wherein if said first battery unit is connected to said battery management system and said balance unit is disabled, then said first battery unit charges said filter capacitor.

15. The open cell detection system of claim 14, wherein a length of said first time period is set so that said filter capacitor fully discharges in said first time period; and
wherein a length of said second time period is set so that said filter capacitor fully charges in said second time period.

16. The open cell detection system of claim 13, wherein said battery management system further comprises a protection unit coupled to said second battery unit and configured to clamp a voltage provided from said second battery unit within a preset value.

17. The open cell detection system of claim 16, wherein said second open cell threshold is set according to said preset value and a maximum operating voltage of said second battery unit.

18. The open cell detection system of claim 13, wherein said first open cell threshold is set according to a minimum operating voltage of said first battery unit.

19. The open cell detection system of claim 13, wherein said under-voltage comparison unit is configured to compare said first voltage with an under-voltage threshold to output a third comparison result after said third time period, and wherein said third comparison result is used to determine whether said first battery unit is under voltage.

20. The open cell detection system of claim 13, wherein said over-voltage comparison unit is configured to compare said second voltage with an over-voltage threshold to output a fourth comparison result after said third time period, and wherein said fourth comparison result is used to determine whether said second battery unit is over voltage.

* * * * *